(12) United States Patent
Liang et al.

(10) Patent No.: US 10,291,994 B2
(45) Date of Patent: May 14, 2019

(54) DETERMINATION METHOD AND APPARATUS FOR PRESET OF AUDIO EQUALIZER (AEQ)

(71) Applicant: China Academy of Telecommunications Technology, Beijing (CN)

(72) Inventors: Min Liang, Beijing (CN); Bo Han, Beijing (CN); Ying Zou, Beijing (CN)

(73) Assignee: CHINA ACADEMY OF TELECOMMUNICATIONS TECHNOLOGY, Beijing (CN)

( * ) Notice: Subject to any disclaimer, the term of this patent is extended or adjusted under 35 U.S.C. 154(b) by 0 days.

(21) Appl. No.: 15/550,358

(22) PCT Filed: Dec. 29, 2015

(86) PCT No.: PCT/CN2015/099576
§ 371 (c)(1),
(2) Date: Aug. 10, 2017

(87) PCT Pub. No.: WO2016/127714
PCT Pub. Date: Aug. 18, 2016

(65) Prior Publication Data
US 2018/0048958 A1 Feb. 15, 2018

(30) Foreign Application Priority Data

Feb. 12, 2015 (CN) .......................... 2015 1 0076632

(51) Int. Cl.
*H03G 5/00* (2006.01)
*H04R 29/00* (2006.01)
(Continued)

(52) U.S. Cl.
CPC ............. *H04R 29/00* (2013.01); *H03G 5/005* (2013.01); *H03G 5/165* (2013.01); *H04R 3/04* (2013.01); *H04R 29/007* (2013.01); *H03H 17/04* (2013.01)

(58) Field of Classification Search
CPC .... G06F 7/499; G06F 7/4991; G06F 7/49915; G06F 7/49921; H03G 5/025;
(Continued)

(56) References Cited

U.S. PATENT DOCUMENTS 9,008,331 B2 * 4/2015 Aggarwal ............... H04S 7/301
333/28 R
2005/0018862 A1 1/2005 Fisher
(Continued)

FOREIGN PATENT DOCUMENTS

CN 1533633 A 9/2004
CN 101155438 A 4/2008
(Continued)

OTHER PUBLICATIONS

Digital biquad filter, Wikipedia, Mar. 2018.*
International Search Report dated Mar. 15, 2016 in the PCT priority application (PCT/CN2015/099576).

*Primary Examiner* — Duc Nguyen
*Assistant Examiner* — Kile O Blair
(74) *Attorney, Agent, or Firm* — Kilpatrick Townsend & Stockton LLP

(57) ABSTRACT

Disclosed are a determination method and apparatus for pre-set set parameters of an audio equalizer (AEQ), which are used for reducing an overflow phenomenon of fixed-point arithmetic output of all levels of second-order infinite impulse response (IIR) filters while frequency response amplitude curves of an AEQ remain unchanged, and reducing non-linear distortion, thus reducing total harmonic distortion (THD) of an AEQ system. The determination method
(Continued)

for pre-set set parameters of an AEQ comprises: determining a first frequency point set by utilizing frequency response amplitude curves of an AEQ; adjusting the frequency response of frequency response amplitude curves of all levels of second-order IIR filters at a frequency point in the first frequency point set, so that the frequency response of the frequency response amplitude curves of all the levels of second-order IIR filters at the frequency point in the first frequency point set satisfies a pre-set condition; and adjusting a first parameter set and a second parameter set according to the adjusting variable of the frequency response amplitude curves of all the levels of second-order IIR filters, and determining the adjusted first parameter set and the adjusted second parameter set as pre-set set parameters of the AEQ.

9 Claims, 8 Drawing Sheets

(51) Int. Cl.
*H04R 3/04* (2006.01)
*H03G 5/16* (2006.01)
*H03H 17/04* (2006.01)

(58) Field of Classification Search
CPC .......... H03G 5/165; H03G 5/005; H04R 3/04; H03B 3/04; H04B 3/143; H04B 3/144; H03H 17/04; H03H 17/0461
See application file for complete search history.

(56) References Cited

U.S. PATENT DOCUMENTS

2010/0017205 A1 1/2010 Visser et al.
2013/0336494 A1 12/2013 Bathgate et al.

FOREIGN PATENT DOCUMENTS

| CN | 101166019 A | 4/2008 |
| CN | 101997500 A | 3/2011 |
| EP | 1322037 A2 | 6/2003 |
| JP | 2007206636 A | 8/2007 |

* cited by examiner

DETERMINATION METHOD AND APPARATUS FOR PRESET OF AUDIO EQUALIZER (AEQ)

CROSS REFERENCE TO RELATED APPLICATION

This application is a US National Stage of International Application No. PCT/CN2015/099576, filed on Dec. 29, 2015, designating the United States, and claiming the benefit of Chinese Patent Application No. 201510076632.0, filed with the Chinese Patent Office on Feb. 12, 2015, and entitled "Method and apparatus for determining preset of audio equalizer", which is hereby incorporated by reference in its entirety.

FIELD

The present invention relates to the field of communications, and particularly to a method and apparatus for determining preset of Audio Equalizer (AEQ).

BACKGROUND

An Audio Equalizer (AEQ) typically enhances, attenuates, or otherwise adjusts different frequency components in an audio signal so that the timbre of the audio signal is adapted to the hearing preference of a user to thereby improve the subjective hearing experience of the user. A parameterized digital AEQ is equivalent in principle to a high-order Infinite Impulse Response (IIR) filter, a frequency response of the high-order IIR filter is uniquely determined by the transfer function associated with the high-order IIR filter.

When the high-order IIR filter is implemented in a fixed-point way on a Digital Signal Processing (DSP) chip, that is, floating-point data is represented as fixed-point data, and hence the practical frequency response of the AEQ model may deviate from the desired theoretic design due to the quantization errors of the coefficients of the filter. In order to alleviate the influence from the quantization errors of the coefficients of the filter, it has been proposed in the prior art to decompose the high-order IIR filter into several second-order IIR filters in cascade. Mathematically the AEQ can be represented as a high-order IIR filter with the following transfer function:

$$H_{AEQ}(z) = \frac{\sum_{k=0}^{k=M} b_k z^{-k}}{1 + \sum_{k=0}^{k=N} a_k z^{-k}},$$

where $N \geq M$, and $\{b_k\}$ and $\{a_k\}$ represent the coefficients of the filter.

The equation above can be factorized into $$H_{AEQ}(z) = \prod_{k=1}^{k=K} H_k(z),$$

where K represents an integer component of $(N+1)/2$, which is the total number of second-order IIR filters. $H_k(z)$ represents the k-th second-order IIR filter with the transfer function of $$H_k(z) = \frac{b_{k0} + b_{k1} z^{-1} + b_{k2} z^{-2}}{1 + a_{k1} z^{-1} + a_{k2} z^{-2}},$$

where $\{b_{ki}, i=0, 1, 2\}$ and $\{a_{ki}, i=1, 2\}$ represent the coefficients of the k-th second-order IIR filter which define the frequency-amplitude curve of the k-th second-order IIR filter. A set $\{a_{k1}, a_{k2}, b_{k0}, b_{k1}, b_{k2}, k=1, 2, \ldots, K\}$ of the coefficients of all the second-order IIR filters defines a preset of the AEQ, which define the system frequency response-amplitude curve of the AEQ.

However for a given preset of an AEQ, there may be such an overflow occurring in fixed-point operations of each second-order IIR filter that results in nonlinear distortion, thus raising Total Harmonic Distortion (THD) of the AEQ, and consequently degrading the performance of the AEQ, especially in a High-Fidelity (HiFi) application.

In summary, given the preset of the AEQ, i.e., the coefficients of all the second-order IIR filters, in the prior art, the frequency response-amplitude curves of the second-order IIR filters are determined, so that there may be such an overflow occurring in an fixed-point output of each second-order IIR filter that results in nonlinear distortion, thus raising the THD of the AEQ, and degrading the performance of the AEQ.

SUMMARY

Embodiments of the invention provide a method and an apparatus for determining preset of Audio Equalizer (AEQ) so as to alleviate an overflow in a fixed-point output of each second-order IIR filter to thereby alleviate nonlinear distortion, thus lowering the THD of the AEQ system, and improving the performance of the AEQ system.

An embodiment of the invention provides a method for determining preset of Audio Equalizer (AEQ), the method including: obtaining a predefined preset of the AEQ, wherein the preset includes a first set of parameters for determining positions of poles of a transfer function of the AEQ system, and a second set of parameters for determining positions of zeros of the transfer function of the AEQ system; determining a frequency response-amplitude curve of the AEQ, and frequency response-amplitude curves of all second-order IIR filters according to the first set of parameters and the second set of parameters, the frequency response-amplitude curves of all the second-order IIR filters which are configured to synthesize the frequency response-amplitude curve of the AEQ; determining a first set of frequencies according to the frequency response-amplitude curve of the AEQ, wherein the frequency response-amplitudes of the AEQ are below or equal to a first pre-defined threshold at the frequencies in the first set of frequencies; adjusting the frequency response-amplitude curves of all the second-order IIR filters at the frequencies in the first set of frequencies accordingly so that the adjusted frequency response-amplitude curves of all the second-order IIR filters at the frequencies in the first set of frequencies satisfy pre-defined conditions, and determining adjustment amounts of the frequency response-amplitude curves of all the second-order IIR filters; and adjusting the first set of parameters, and the second set of parameters according to the adjustment amounts of the frequency response-amplitude curves of all the second-order IIR filters, and determining the adjusted first set of parameters, and the adjusted second set of parameters as the preset of the AEQ.

In the method above in accordance with the embodiment of the invention, the frequency response-amplitude curve of the AEQ, and the frequency response-amplitude curves of all the second-order IIR filters which are configured to synthesize the frequency response-amplitude curve of the AEQ are determined according to the predefined preset of the AEQ; the first set of frequencies is determined according to the frequency response-amplitude curve of the AEQ; the frequency response-amplitude curves of all the second-order IIR filters at the frequencies in the first set of frequencies are adjusted accordingly so that the adjusted frequency response-amplitude curves of all the second-order IIR filters at the frequencies in the first set of frequencies satisfy the pre-defined conditions, for example, the sum of the adjusted frequency response-amplitude curves of all the first K−1 second-order IIR filters at each of the frequencies in the first set of frequencies is below or equal to the first pre-defined threshold without changing the frequency response-amplitude curve of the AEQ; and the preset is adjusted according to the adjustment amounts of the frequency response-amplitude curves of all the second-order IIR filters. As compared with the prior art where there may be such an overflow occurring in fixed-point operations of each of all the second-order IIR filters that results in nonlinear distortion, thus raising the THD of the AEQ, frequency response gains of all the second-order IIR filters can be adjusted without changing the frequency response-amplitude curve of the AEQ to thereby alleviate overflows in the fixed-point operations of all the second-order IIR filters so as to alleviate nonlinear distortion, thus lowering the THD of the AEQ system, and improving the performance of the AEQ system.

In a possible implementation, in the method above in accordance with the embodiment of the invention, after the frequency response-amplitude curve of the AEQ and the frequency response-amplitude curves of all the second-order IIR filters which are configured to synthesize the frequency response-amplitude curve of the AEQ are determined according to the first set of parameters and the second set of parameters, and before the first set of frequencies is determined according to the frequency response-amplitude curve of the AEQ, the method further includes: determining the frequency response corresponding to the centroid of the frequency response-amplitude curve of the AEQ; and when the frequency response corresponding to the centroid of the frequency response-amplitude curve of the AEQ is above a second pre-defined threshold, translating the frequency response-amplitude curve of the AEQ by a pre-defined distance in a pre-defined direction; wherein determining the first set of frequencies according to the frequency response-amplitude curve of the AEQ includes: when the frequency response corresponding to the centroid of the frequency response-amplitude curve of the AEQ is below or equal to the second pre-defined threshold, determining the first set of frequencies according to the frequency response-amplitude curve of the AEQ; and when the frequency response corresponding to the centroid of the frequency response-amplitude curve of the AEQ is above the second pre-defined threshold, determining the first set of frequencies according to the translated frequency response-amplitude curve of the AEQ.

In a possible implementation, in the method above in accordance with the embodiment of the invention, determining the first set of frequencies according to the frequency response-amplitude curve of the AEQ includes: determining a second set of frequencies according to the frequency response-amplitude curve of the AEQ, wherein frequency responses of the frequency response-amplitude curve of the AEQ at the frequencies in the second set of frequencies are above the first pre-defined threshold; and determining a complement set of the second set of frequencies in a complete set as the first set of the frequencies, wherein the complete set is a set consisted of all the frequencies in the frequency response-amplitude curve of the AEQ.

In a possible implementation, in the method above in accordance with the embodiment of the invention, the pre-defined conditions include: a first condition that the frequency response-amplitudes of the first second-order IIR filter at the frequencies in the first set of frequencies are below or equal to a third pre-defined threshold; a second condition that the sum of the frequency response-amplitude curves of any M consecutive second-order IIR filters starting with the frequency response-amplitude curve of the first second-order IIR filter at each of the frequencies in the first set of frequencies is below or equal to a third pre-defined threshold, wherein M is any of the natural number which is more than 1 and less than the total number K of all the second-order IIR filters, and the third pre-defined threshold is less than or equal to the first pre-defined threshold; and a third condition that the sum of the frequency response-amplitude curves of all the second-order IIR filters at each of the frequencies in the first set of frequencies is equal to the frequency response-amplitude curve of the AEQ at the same frequency.

In a possible implementation, in the method above in accordance with the embodiment of the invention, all data type of all the parameters in the predefined preset of the AEQ is the fixed-point type; and after the predefined preset of the AEQ is obtained, and before the frequency response-amplitude curve of the AEQ, and the frequency response-amplitude curves of all the second-order IIR filters which are configured to synthesize the frequency response-amplitude curve of the AEQ are determined according to the first set of parameters, and the second set of parameters, the method further includes: converting all the parameters in the first set of parameters, and the second set of parameters from the fixed-point type to the floating-point type; and after the first set of parameters, and the second set of parameters are adjusted according to the adjustment amounts of the frequency response-amplitude curves of all the second-order IIR filters, and before the adjusted first set of parameters, and the adjusted second set of parameters are determined as the preset of the AEQ, the method further includes: converting all the parameters in the adjusted first set of parameters, and the adjusted second set of parameters from the floating-point type to the fixed-point type; wherein determining the frequency response-amplitude curve of the AEQ, and the frequency response-amplitude curves of all the second-order IIR filters which are configured to synthesize the frequency response-amplitude curve of the AEQ, according to the first set of parameters, and the second set of parameters includes: determining the frequency response-amplitude curve of the AEQ, and the frequency response-amplitude curves of all the second-order IIR filters which are configured to synthesize the frequency response-amplitude curve of the AEQ according to the floating-point parameters in the first set of parameters, and the second set of parameters; and determining the adjusted first set of parameters, and the adjusted second set of parameters as the preset of the AEQ includes: determining the fixed-point parameters in the adjusted first set of parameters, and the adjusted second set of parameters as the preset of the AEQ.

An embodiment of the invention provides an apparatus for determining the preset of the Audio Equalizer (AEQ), the apparatus including: an obtaining unit configured to obtain the predefined preset of the AEQ, wherein the preset includes a first set of parameters for determining positions of poles of the transfer function of the AEQ system, and a second set of parameters for determining positions of zeros of the transfer function of the AEQ system; a first processing unit, connected with the obtaining unit, configured to determine the frequency response-amplitude curve of the AEQ, and the frequency response-amplitude curves of all the second-order IIR filters according to the first set of parameters and the second set of parameters, the frequency response-amplitude curves of all the second-order IIR filters being configured to synthesize the frequency response-amplitude curve of the AEQ, and to determine the first set of frequencies from the frequency response-amplitude curve of the AEQ, wherein the frequency response-amplitudes of the AEQ are below or equal to the first pre-defined threshold at the frequencies in the first set of frequencies; and a second processing unit, connected with the first processing unit, configured to adjust the frequency response-amplitude curves of all the second-order IIR filters at the frequencies in the first set of frequencies accordingly so that the adjusted frequency response-amplitude curves of all the second-order IIR filters at the frequencies in the first set of frequencies satisfy the pre-defined conditions, and to determine the adjustment amounts of the frequency response-amplitude curves of all the second-order IIR filters; and to adjust the first set of parameters, and the second set of parameters according to the adjustment amounts of the frequency response-amplitude curves of all the second-order IIR filters, and to determine the adjusted first set of parameters, and the adjusted second set of parameters as the preset of the AEQ.

In the apparatus above in accordance with the embodiment of the invention, the frequency response-amplitude curve of the AEQ, and the frequency response-amplitude curves of all the second-order IIR filters which are configured to synthesize the frequency response-amplitude curve of the AEQ are determined according to the predefined preset of the AEQ; the first set of frequencies is determined from the frequency response-amplitude curve of the AEQ; the frequency response-amplitude curves of all the second-order IIR filters at the frequencies in the first set of frequencies are adjusted accordingly so that the adjusted frequency response-amplitude curves of all the second-order IIR filters at the frequencies in the first set of frequencies satisfy the pre-defined conditions, for example, the sum of the adjusted frequency response-amplitude curves of all the first K−1 second-order IIR filters at each of the frequencies in the first set of frequencies is below or equal to the first pre-defined threshold without changing the frequency response-amplitude curve of the AEQ; and the preset is adjusted according to the adjustment amounts of the frequency response-amplitude curves of all the second-order IIR filters. As compared with the prior art where there may be such an overflow occurring in each fixed-point output of the each second-order IIR filter that results in nonlinear distortion, thus raising the THD of the AEQ, frequency response gains of all the second-order IIR filters can be adjusted without changing the frequency response-amplitude curve of the AEQ to thereby alleviate overflows in the fixed-point outputs of all the second-order IIR filters so as to alleviate nonlinear distortion, thus lowering the THD of the AEQ system, and improving the performance of the AEQ system.

In a possible implementation, in the apparatus above in accordance with the embodiment of the invention, after the frequency response-amplitude curve of the AEQ and the frequency response-amplitude curves of all the second-order IIR filters which are configured to synthesize the frequency response-amplitude curve of the AEQ are determined according to the first set of parameters and the second set of parameters, and before the first set of frequencies is determined from the frequency response-amplitude curve of the AEQ, the first processing unit is further configured: to determine a frequency response corresponding to the centroid of the frequency response-amplitude curve of the AEQ; and when the frequency response corresponding to the centroid of the frequency response-amplitude curve of the AEQ is above the second pre-defined threshold, to translate the frequency response-amplitude curve of the AEQ by the pre-defined distance in the pre-defined direction; wherein the first processing unit configured to determine the first set of frequencies according to the frequency response-amplitude curve of the AEQ is configured: when the frequency response corresponding to the centroid of the frequency response-amplitude curve of the AEQ is below or equal to the second pre-defined threshold, to determine the first set of frequencies according to the frequency response-amplitude curve of the AEQ; and when the frequency response corresponding to the centroid of the frequency response-amplitude curve of the AEQ is above the second pre-defined threshold, to determine the first set of frequencies according to the translated frequency response-amplitude curve of the AEQ.

In a possible implementation, in the apparatus above in accordance with the embodiment of the invention, the first processing unit configured to determine the first set of frequencies according to the frequency response-amplitude curve of the AEQ is configured: to determine the second set of frequencies from the frequency response-amplitude curve of the AEQ, wherein the frequency response-amplitude curve of the AEQ at frequencies corresponding to the frequencies in the second set of frequencies are above the first pre-defined threshold; and to determine the complement set of the second set of frequencies in the complete set as the first set of frequencies, wherein the complete set is a set consisted of all the frequencies in the frequency response-amplitude curve of the AEQ.

In a possible implementation, in the apparatus above in accordance with the embodiment of the invention, the pre-defined condition includes: the first condition that the frequency response-amplitudes of the first second-order IIR filter at the frequencies in the first set of frequencies are below or equal to the third pre-defined threshold; the second condition that the sum of the frequency response-amplitude curves of any M consecutive second-order IIR filters starting with the frequency response-amplitude curve of the first second-order IIR filter at each of the frequencies in the first set of frequencies is below or equal to the third pre-defined threshold, wherein M is any natural number which is more than 1 and less than the total number K of all the second-order IIR filters, and the third pre-defined threshold is less than or equal to the first pre-defined threshold; and the third condition that the sum of the frequency response-amplitude curves of all the second-order IIR filters at each of the frequencies in the first set of frequencies is equal to the frequency response-amplitude curve of the AEQ at the same frequency.

In a possible implementation, in the apparatus above in accordance with the embodiment of the invention, all data type of all the parameters in the predefined preset of the AEQ is the fixed-point type; and after the obtaining unit obtains the predefined preset of the AEQ, and before the first processing unit determines the frequency response-amplitude curve of the AEQ, and the frequency response-amplitude curves of all the second-order IIR filters which are configured to synthesize the frequency response-amplitude curve of the AEQ, according to the first set of parameters, and the second set of parameters, the first processing unit is further configured: to convert all the parameters in the first set of parameters, and the second set of parameters from the fixed-point type to the floating-point type; and after the second processing unit adjusts the first set of parameters, and the second set of parameters according to the adjustment amounts of the frequency response-amplitude curves of all the second-order IIR filters, and before the second processing unit determines the adjusted first set of parameters, and the adjusted second set of parameters as the preset of the AEQ, the second processing unit is further configured: to convert all the parameters in the adjusted first set of parameters, and the adjusted second set of parameters from the floating-point type to the fixed-point type; wherein the first processing unit configured to determine the frequency response-amplitude curve of the AEQ, and the frequency response-amplitude curves of all the second-order IIR filters which are configured to synthesize the frequency response-amplitude curve of the AEQ, according to the first set of parameters and the second set of parameters, is specifically configured: to determine the frequency response-amplitude curve of the AEQ, and the frequency response-amplitude curves of all the second-order IIR filters which are configured to synthesize the frequency response-amplitude curve of the AEQ according to the floating-point parameters in the first set of parameters, and the second set of parameters; and the second processing unit configured to determine the adjusted first set of parameters, and the adjusted second set of parameters as the preset of the AEQ is configured to determine the fixed-point parameters in the adjusted first set of parameters, and the adjusted second set of parameters as the preset of the AEQ.

An embodiment of the invention provides an apparatus for determining a preset of an Audio Equalizer (AEQ), the apparatus including:

a transceiver configured to obtain the predefined preset of the AEQ, wherein the preset includes a first set of parameters for determining positions of poles of the transfer function of the AEQ system, and a second set of parameters for determining positions of zeros of the transfer function of the AEQ system; and a processor configured to read program in a memory to execute:

to determine the frequency response-amplitude curve of the AEQ, and the frequency response-amplitude curves of all the second-order IIR filters according to the first set of parameters and the second set of parameters, the frequency response-amplitude curves of all the second-order IIR filters being configured to synthesize the frequency response-amplitude curve of the AEQ, and to determine the first set of frequencies according to the frequency response-amplitude curve of the AEQ, wherein the frequency response-amplitudes of the AEQ are below or equal to the first pre-defined threshold at the frequencies in the first set of frequencies; to adjust the frequency response-amplitude curves of all the second-order IIR filters at the frequencies in the first set of frequencies accordingly so that the adjusted frequency response-amplitude curves of all the second-order IIR filters at the frequencies in the first set of frequencies satisfy the pre-defined conditions, and to determine the adjustment amounts of the frequency response-amplitude curves of all the second-order IIR filters; and to adjust the first set of parameters, and the second set of parameters according to the adjustment amounts of the frequency response-amplitude curves of all the second-order IIR filters, and to determine the adjusted first set of parameters, and the adjusted second set of parameters as the preset of the AEQ.

In the apparatus above in accordance with the embodiment of the invention, the frequency response-amplitude curve of the AEQ, and the frequency response-amplitude curves of all the second-order IIR filters which are configured to synthesize the frequency response-amplitude curve of the AEQ are determined according to the predefined preset of the AEQ; the first set of frequencies is determined according to the frequency response-amplitude curve of the AEQ; the frequency response-amplitude curves of all the second-order IIR filters at the frequencies in the first set of frequencies are adjusted accordingly so that the adjusted frequency response-amplitude curves of all the second-order IIR filters at the frequencies in the first set of frequencies satisfy the pre-defined conditions, for example, the sum of the frequency response-amplitude curves of all the first $K-1$ second-order IIR filters at each of the frequencies in the first set of frequencies is below or equal to the first pre-defined threshold without changing the frequency response-amplitude curve of the AEQ; and the preset is adjusted according to the adjustment amounts of the frequency response-amplitude curves of all the second-order IIR filters. As compared with the prior art where there may be such an overflow occurring in each fixed-point output of all the second-order IIR filters that results in nonlinear distortion, thus raising the THD of the AEQ, frequency response gains of all the second-order IIR filters can be adjusted without changing the frequency response-amplitude curve of the AEQ to thereby alleviate possible overflows in the outputs of fixed-point operations of all the second-order IIR filters so as to alleviate nonlinear distortion, thus lowering the THD of the AEQ system, and improving the performance of the AEQ system.

In a possible implementation, in the apparatus above in accordance with the embodiment of the invention, after the frequency response-amplitude curve of the AEQ and the frequency response-amplitude curves of all the second-order IIR filters which are configured to synthesize the frequency response-amplitude curve of the AEQ are determined according to the first set of parameters and the second set of parameters, and before the first set of frequencies is determined from the frequency response-amplitude curve of the AEQ, the processor is further configured: to determine a frequency response corresponding to the centroid of the frequency response-amplitude curve of the AEQ; and when the frequency response corresponding to the centroid of the frequency response-amplitude curve of the AEQ is above the second pre-defined threshold, to translate the frequency response-amplitude curve of the AEQ by the pre-defined distance in the pre-defined direction; wherein the processor configured to determine the first set of frequencies from the frequency response-amplitude curve of the AEQ is configured: when the frequency response corresponding to the centroid of the frequency response-amplitude curve of the AEQ is below or equal to the second pre-defined threshold, to determine the first set of frequencies according to the frequency response-amplitude curve of the AEQ; and when the frequency response corresponding to the centroid of the frequency response-amplitude curve of the AEQ is above the second pre-defined threshold, to determine the first set of frequencies according to the translated frequency response-amplitude curve of the AEQ.

In a possible implementation, in the apparatus above in accordance with the embodiment of the invention, the processor configured to determine the first set of frequencies from the frequency response-amplitude curve of the AEQ is configured:

to determine the second set of frequencies according to the frequency response-amplitude curve of the AEQ, wherein the frequency response-amplitudes of the AEQ at the frequencies in the second set of frequencies are above the first pre-defined threshold; and to determine the complement set of the second set of frequencies in a complete set as the first set of frequencies, wherein the complete set is a set consisted of all the frequencies in the frequency response-amplitude curve of the AEQ.

In a possible implementation, in the apparatus above in accordance with the embodiment of the invention, the pre-defined conditions include:

the first condition that the frequency response-amplitudes of the first second-order IIR filter at the frequencies in the first set of frequencies are below or equal to a third pre-defined threshold;

the second condition that the sum of the frequency response-amplitude curves of any M consecutive second-order IIR filters starting with the frequency response-amplitude curve of the first second-order IIR filter at each of the frequencies in the first set of frequencies is below or equal to the third pre-defined threshold, wherein M is any natural number which is more than 1 and less than the total number K of second-order IIR filters, and the third pre-defined threshold is less than or equal to the first pre-defined threshold; and the third condition that the sum of the frequency response-amplitude curves of all the second-order IIR filters at each of the frequencies in the first set of frequencies is equal to the frequency response of the frequency response-amplitude curve of the AEQ at the same frequency.

In a possible implementation, in the apparatus above in accordance with the embodiment of the invention, all data type of all the parameters in the predefined preset of the AEQ is the fixed-point type; and after the transceiver obtains the predefined preset of the AEQ, and before the processor determines the frequency response-amplitude curve of the AEQ, and the frequency response-amplitude curves of all the second-order IIR filters which are configured to synthesize the frequency response-amplitude curve of the AEQ, according to the first set of parameters, and the second set of parameters, the processor is further configured: to convert all the parameters in the first set of parameters, and the second set of parameters from the fixed-point type to the floating-point type; and after the processor adjusts the first set of parameters, and the second set of parameters according to the adjustment amounts of the frequency response-amplitude curves of all the second-order IIR filters, and before the processor determines the adjusted first set of parameters, and the adjusted second set of parameters as the preset of the AEQ, the processor is further configured: to convert all the parameters in the adjusted first set of parameters, and the adjusted second set of parameters from the floating-point type to the fixed-point type, wherein:

the processor configured to determine the frequency response-amplitude curve of the AEQ, and the frequency response-amplitude curves of all the second-order IIR filters which are configured to synthesize the frequency response-amplitude curve of the AEQ, according to the first set of parameters, and the second set of parameters is configured: to determine the frequency response-amplitude curve of the AEQ, and the frequency response-amplitude curves of all the second-order IIR filters which are configured to synthesize the frequency response-amplitude curve of the AEQ according to the floating-point parameters in the first set of parameters, and the second set of parameters; and the processor configured to determine the adjusted first set of parameters, and the adjusted second set of parameters as the preset of the AEQ is configured to determine the fixed-point parameters in the adjusted first set of parameters, and the adjusted second set of parameters as the preset of the AEQ.

DETAILED DESCRIPTION OF THE EMBODIMENTS

In order to make the objects, technical solutions, and advantages of the embodiments of the invention more apparent, the technical solutions according to the embodiments of the invention will be described below in further details with reference to the drawings in the embodiments of the invention, and apparently the embodiments described below are only a part but not all of the embodiments of the invention. Based upon the embodiments here of the invention, all the other embodiments which can occur to those ordinarily skilled in the art without any inventive effort shall fall into the scope of the invention.

Particular embodiments of a method and apparatus for determining a preset of an Audio Equalizer (AEQ) in accordance with the invention will be described below in details with reference to the drawings.

It shall be noted that the amplitudes in all the frequency response-amplitude curves mentioned in the embodiments of the invention are in decibels (dB). A high-order IIR filter can be decomposed into several concatenated low-order IIR filters, where a low-order IIR filter generally refers to a second-order IIR filter. Of course, those skilled in the art shall appreciate that when some parameters of the second-order IIR filter are zeros, then it may be transformed into a first-order IIR filter. The low-order IIR filter will be described taking a second-order IIR filter as an example throughout the embodiments of the invention.

Given a sampling frequency $f_s$ (Hz) and a preset of $\{a_{k1}, a_{k2}, b_{k0}, b_{k1}, b_{k2}, k=1, 2, \ldots, K\}$, a system frequency response function $G_{AEQ}(f)$ of an AEQ is $$G_{AEQ}(f) = \prod_{k=1}^{k=K} G_k(f),$$

where $G_k(f)$ represents the frequency response function of the k-th second-order IIR filter of the AEQ as $$G_k(f) = \frac{b_{k0} + b_{k1}e^{-j\frac{2\pi f}{f_s}} + b_{k2}e^{-j\frac{4\pi f}{f_s}}}{1 + a_{k1}e^{-j\frac{2\pi f}{f_s}} + a_{k2}e^{-j\frac{4\pi f}{f_s}}},$$

where f represents the frequency of sound, and $f_s$ represents the sampling frequency, so the frequency response-amplitude curve of the AEQ is $$L_{AEQ}(f) = 20\log_{10}|G_{AEQ}(f)| = \sum_{k=1}^{k=K} L_k(f),$$

where $L_k(f)$ represents the frequency response-amplitude curve of the k-th second-order IIR filter, particularly as $L_k(f) = 20 \log_{10}|G_k(f)|$. For the k-th second-order IIR filter, given a 0 dBFS sinuous tone input signal at a frequency f' thereto, if $L_k(f')>0$ dB, then there will be an overflow occurring in an output thereof.

Figure 1:
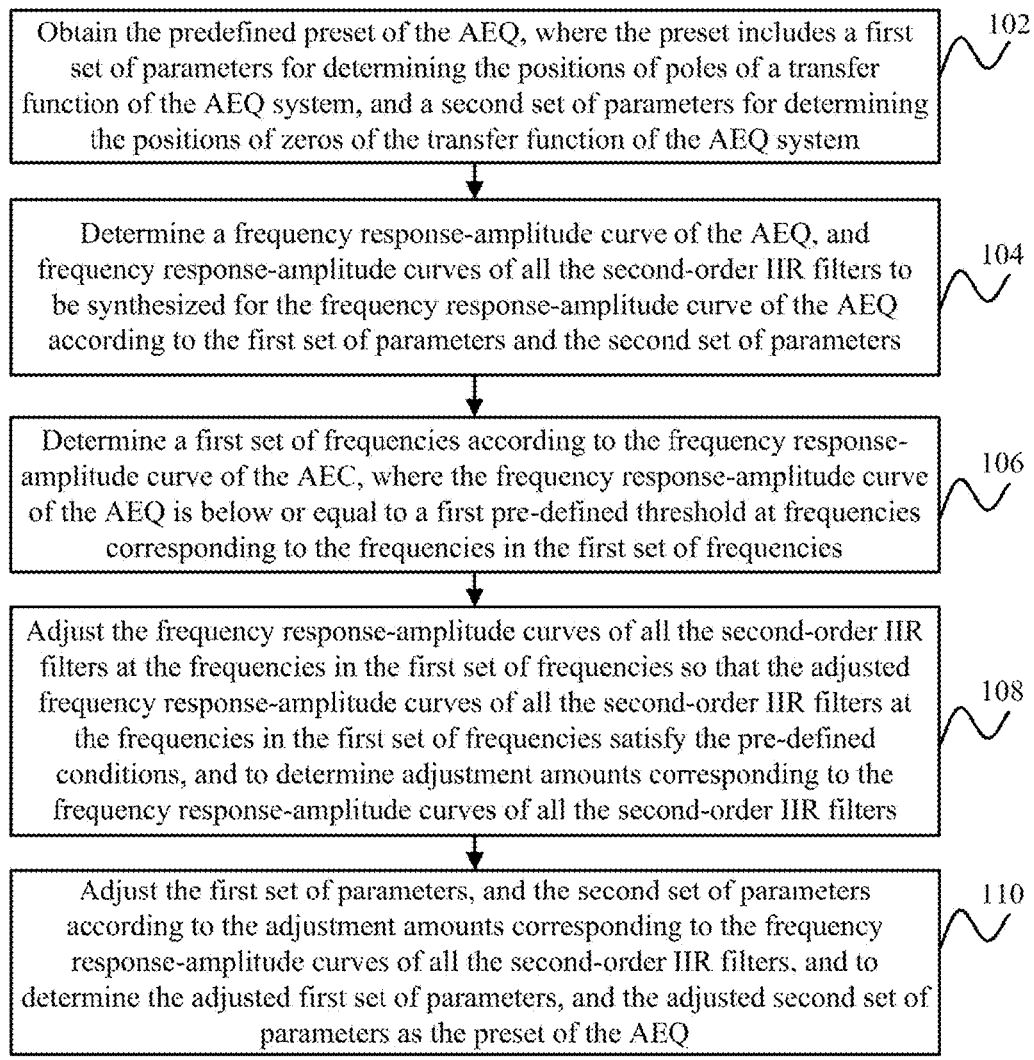
FIG. 1 is a schematic flow chart of a method for determining a preset of an Audio Equalizer (AEQ) in accordance with an embodiment of the invention.

For the given preset, in order to alleviate overflows in fixed-point operations of all the second-order IIR filters of an AEQ system, an embodiment of the invention provides a method for determining a preset of an Audio Equalizer (AEQ) as illustrated in FIG. 1, where the method includes the following steps:

The step 102 is to obtain the predefined preset of the AEQ, where the preset includes the first set of parameters for determining the positions of poles of the transfer function of the AEQ system, and the second set of parameters for determining the positions of zeros of the transfer function of the AEQ system;

The step 104 is to determine the frequency response-amplitude curve of the AEQ, and frequency response-amplitude curves of all the second-order IIR filters which are configured to synthesize the frequency response-amplitude curve of the AEQ according to the first set of parameters and the second set of parameters;

The step 106 is to determine the first set of frequencies according to the frequency response-amplitude curve of the AEQ, where the frequency response-amplitudes of the AEQ are below or equal to the first pre-defined threshold at frequencies in the first set of frequencies;

The step 108 is to adjust frequency responses of the frequency response-amplitude curves of all the second-order IIR filters at the frequencies in the first set of frequencies accordingly so that the adjusted frequency response-amplitude curves of all the second-order IIR filters at the frequencies in the first set of frequencies satisfy the pre-defined conditions, and to determine the adjustment amounts of the frequency response-amplitude curves of all the second-order IIR filters; and The step 110 is to adjust the first set of parameters, and the second set of parameters according to the adjustment amounts of the frequency response-amplitude curves of all the second-order IIR filters, and to determine the adjusted first set of parameters, and the adjusted second set of parameters as the preset of the AEQ.

In the apparatus above in accordance with the embodiment of the invention, the frequency response-amplitude curve of the AEQ, and the frequency response-amplitude curves of all the second-order IIR filters which are configured to synthesize the frequency response-amplitude curve of the AEQ are determined according to the predefined preset of the AEQ; the first set of frequencies is determined according to the frequency response-amplitude curve of the AEQ; the frequency response-amplitude curves of all the second-order IIR filters at the frequencies in the first set of frequencies are adjusted accordingly so that the adjusted frequency response-amplitude curves of all the second-order IIR filters at the frequencies in the first set of frequencies satisfy the pre-defined conditions, for example, the sum of the frequency response-amplitude curves of all the first K−1 second-order IIR filters at each of the frequencies in the first set of frequencies is below or equal to the first pre-defined threshold without changing the frequency response-amplitude curve of the AEQ; and the preset is adjusted according to the adjustment amounts of the frequency response-amplitude curves of all the second-order IIR filters. As compared with the prior art where there may be such an overflow occurring in each fixed-point output of all the second-order IIR filters that results in nonlinear distortion, thus raising the THD of the AEQ, frequency response gains of all the second-order IIR filters can be adjusted without changing the frequency response-amplitude curve of the AEQ to thereby alleviate possible overflows in the outputs of fixed-point operations of all the second-order IIR filters so as to alleviate nonlinear distortion, thus lowering the THD of the AEQ system, and improving the performance of the AEQ system.

In a particular implementation, there is a preset of $\{a_{k1}, a_{k2}, b_{k0}, b_{k1}, b_{k2}, k=1, 2, \ldots, K\}$ including the first set of parameter $\{a_{k1}, a_{k2}, k=1, 2, \ldots, K\}$ for determining the positions of poles of the transfer function of the AEQ system, and the second set of parameters $\{b_{k0}, b_{k1}, b_{k2}, k=1, 2, \ldots, K\}$ for determining the positions of zeros of the transfer function of the AEQ system, and after the predefined preset is obtained, the frequency response-amplitude curve of the AEQ, and the frequency response-amplitude curves of all the second-order IIR filters which are configured to synthesize the frequency response-amplitude curve of the AEQ can be determined according to the first set of parameters and the second set of parameters.

The first set of frequencies is determined from the frequency response-amplitude curve of the AEQ, and the corresponding frequency response-amplitudes of the AEQ at the frequencies in the first set of frequencies are below or equal to the first pre-defined threshold, that is, the frequencies corresponding to the frequencies at which the frequency response amplitudes are below or equal to the first pre-defined threshold are determined in the frequency response-amplitude curve of the AEQ, where the first preset threshold can be zero decibel, or can be pre-defined as required for the AEQ system, so that the frequency response amplitudes of the AEQ at the frequencies in the first set of frequencies are below or equal to the first pre-defined threshold. Of course, the first set of frequencies may be determined differently for the different frequency response-amplitude curve of the AEQ.

In a possible implementation, in the method in accordance with the embodiment of the invention, after the frequency response-amplitude curves of all the second-order IIR filters which are configured to synthesize the frequency response-amplitude curve of the AEQ are determined according to the first set of parameters and the second set of parameters, and before the first set of frequencies is determined from the frequency response-amplitude curve of the AEQ, the method further includes: determining a frequency response corresponding to the centroid of the frequency response-amplitude curve of the AEQ; and when the frequency response corresponding to the centroid of the frequency response-amplitude curve of the AEQ is above the second pre-defined threshold, translating the frequency response-amplitude curve of the AEQ by the pre-defined distance in the pre-defined direction, where the pre-defined direction is the negative direction of the ordinate.

Particularly the first set of frequencies is determined according to the frequency response-amplitude curve of the AEQ in the following two instances:

In the first instance, when the frequency response corresponding to the centroid of the frequency response-amplitude curve of the AEQ is below or equal to the second pre-defined threshold, then the first set of frequencies is determined according to the frequency response-amplitude curve of the AEQ; and In the second instance, when the frequency response corresponding to the centroid of the frequency response-amplitude curve of the AEQ is above the second pre-defined threshold, then the first set of frequencies is determined according to the translated frequency response-amplitude curve of the AEQ.

Particularly the value of the second pre-defined threshold can be zero decibel, or can be pre-defined as required for the AEQ system. The centroid of the frequency response-amplitude curve of the AEQ can be determined in a number of ways, although a detailed description thereof will be omitted here; and in a particular embodiment, it can be determined otherwise whether to translate the frequency response-amplitude curve of the AEQ by the pre-defined distance in the pre-defined direction.

Firstly the maximum and the minimum of the frequency response-amplitude curve of the AEQ are calculated as $L_{max}=\max_{f\in[0,\,fs/2]}\{L_{AEQ}(f)\}$, and $L_{min}=\min_{f\in[0,\,fs/2]}\{L_{AEQ}(f)\}$, where f represents the frequency of sound, and $f_s$ represents the sampling frequency; and as per the Nyquist theory, a digital signal representing sound can be recovered as the original sound only if a sampling frequency is higher than twice the highest frequency of the sound, so $f\in[0, fs/2]$.

A discriminative variable "ratio" is defined as ratio=$(0-L_{min})/(L_{max}-L_{min})$, and when the discriminative variable "ratio" is above the decision threshold, then the flow proceeds in the first instance; or when the discriminative variable "ratio" is below or equal to the decision threshold, then the flow proceeds in the second instance, where the value of the decision threshold ranges from 0 to ½, and preferably [⅛, ¼].

When the discriminative variable "ratio" is below or equal to the decision threshold, then the frequency response-amplitude curve of the AEQ is translated by the pre-defined distance in the pre-defined direction, where the translation in the pre-defined direction includes downward translation, and the pre-defined distance may be calculated as a function of the maximum and the minimum of the frequency response-amplitude curve of the AEQ, but may be calculated differently in different embodiments as long as the discriminative variable "ratio" of the translated frequency response-amplitude curve of the AEQ is above the decision threshold. In a particular embodiment, the pre-defined distance is $\delta=L_{min}+\lambda\times(L_{max}-L_{min})$, where λ represents a control factor, and the value of λ ranges from 0 to 1, and preferably from 0.4 to 0.6.

It shall be noted that in the embodiment of the invention, the frequency response-amplitude curve of the AEQ is translated by the pre-defined distance in the pre-defined direction merely for the purpose of determining the first set of frequencies from the translated frequency response-amplitude curve of the AEQ, and the frequency response-amplitude curves of all the second-order IIR filters at the frequencies in the first set of frequencies are still adjusted by adjusting the frequency response-amplitude curves of all the second-order IIR filters which are configured to synthesize the original frequency response-amplitude curve of the AEQ (i.e., the frequency response-amplitude curve of the AEQ before the translation).

In a possible implementation, in the method in accordance with the embodiment of the invention, the first set of frequencies is determined from the translated frequency response-amplitude curve of the AEQ particularly by determining the second set of frequencies from the translated frequency response-amplitude curve of the AEQ, where frequency responses of the frequency response-amplitude curve of the AEQ at frequencies in the second set of frequencies are above the first pre-defined threshold; and determining the complement set of the second set of frequencies in the complete set, where the complete set is a set consisted of all the frequencies in the frequency response-amplitude curve of the AEQ.

In a particular implementation, when the first pre-defined threshold is zero decibel, for example, then the frequencies in the frequency response-amplitude curve of the AEQ, at which the frequency responses are below or equal to zero decibel may be determined by firstly determining the frequencies in the frequency response-amplitude curve of the AEQ, at which the frequency response amplitudes are above zero decibel, as the second set of frequencies, and then calculating the complement set of the second set of frequencies in the complete set as the first set of frequencies, where the complete set is a set consisted of all the frequencies in the frequency response-amplitude curve of the AEQ. When the number of frequencies in the first set of frequencies is more than the number of frequencies in the second set of frequencies, then a workload of calculation can be reduced.

In a possible implementation, in the method in accordance with the embodiment of the invention, the pre-defined conditions include: the first condition that the frequency response-amplitudes of the first second-order IIR filter at the frequencies in the first set of frequencies are below or equal to the third pre-defined threshold; the second condition that the sum of the frequency response-amplitude curves of any M consecutive second-order IIR filters starting with the frequency response-amplitude curve of the first second-order IIR filter at each of the frequencies in the first set of frequencies is below or equal to the third pre-defined threshold, where M is any natural number which is more than 1 and less than the total number K of all the second-order IIR filters, and the third pre-defined threshold is less than or equal to the first pre-defined threshold; and the third condition that the sum of the frequency response-amplitude curves of all the second-order IIR filters at each of the frequencies in the first set of frequencies is equal to the frequency response-amplitude curve of the AEQ at the same frequency.

In a particular implementation, the frequency response amplitudes of all the second-order IIR filters at the frequencies in the first set of frequencies are adjusted so that the adjusted frequency response amplitudes of all the second-order IIR filters at the frequencies in the first set of frequencies satisfy all of the first condition, the second condition, and the third condition, that is, there will be no overflows in the outputs of fixed-point operations of all the first K−1 second-order IIR filters at the frequencies in the first set of frequencies without changing the frequency response-amplitude curve of the AEQ to thereby alleviate nonlinear distortion, thus lowering the total harmonic distortion of the AEQ, and improving the performance of the AEQ, where the third pre-defined threshold is less than or equal to the first pre-defined threshold, and preferably the third pre-defined threshold is equal to the first pre-defined threshold.

Figure 2A:
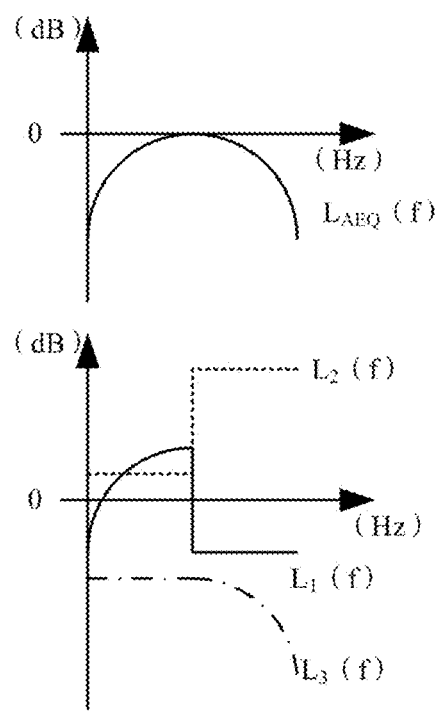
FIG. 2A to FIG. 2D are schematic principle diagrams of a method for determining a preset of an Audio Equalizer (AEQ) in accordance with an embodiment of the invention.
Figure 2B:
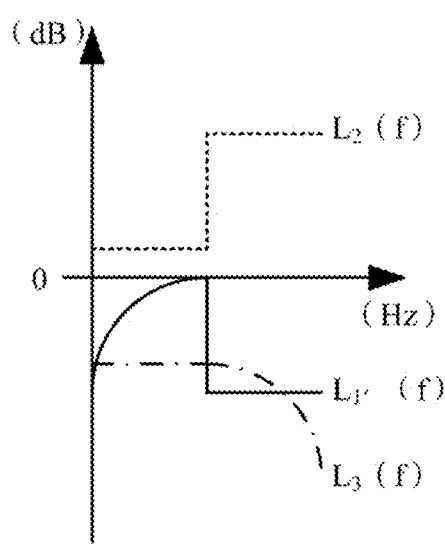

In a particular embodiment, as illustrated in FIG. 2A, the abscissa represents a frequency f, and the ordinate represents a frequency response amplitude in dB; and when the pre-defined preset of $\{a_{k1}, a_{k2}, b_{k0}, b_{k1}, b_{k2}, k=1, 2, 3\}$ includes the first set of parameters $\{a_{k1}, a_{k2}, k=1, 2, 3\}$, and the second set of parameters $\{b_{k0}, b_{k1}, b_{k2}, k=1, 2, 3\}$, and for f∈[0, fs/2], $L_{AEQ}$ (f)≤0 dB holds true, that is, all the frequency responses at the frequencies in the frequency response-amplitude curve of the AEQ are below 0 dB, and then the discriminative variable "ratio" can be ratio=(0−$L_{min}$)/($L_{max}$−$L_{min}$). Since $L_{max}$ is equal to 0, the discriminative variable is 1, and thus above the decision threshold (as can be apparent from FIG. 2A, the frequency response corresponding to the centroid of the frequency response-amplitude curve of the AEQ is sure to be below 0 dB), so the first set of frequencies is determined from the frequency response-amplitude curve of the AEQ, where the first set of frequencies is a set consisted of those frequencies in the frequency response-amplitude curve of the AEQ at which the frequency responses are below 0 dB, so the first set of frequencies is the complete set; and the frequency response-amplitude curves of the three second-order IIR filters, which are $L_1(f)$, $L_2(f)$, and $L_3(f)$ respectively, are synthesized $L_{AEQ}(f)$, where as can be apparent from FIG. 2A, all the frequency response amplitudes of $L_1(f)$ and $L_1(f)+L_2(f)$ at the respective frequencies in the first set of frequencies are above 0 dB, thus possibly resulting in nonlinear distortion, which would increase the THD of the AEQ. The frequency response-amplitude curves of all the second-order IIR filters are adjusted to thereby alleviate the overflows in the fixed-point outputs of all the second-order IIR filters so as to lower the THD of the AEQ, particularly as follows:

When the frequency response-amplitude curves of the three second-order IIR filters are adjusted, firstly to ensure the adjusted frequency response amplitudes of the first second-order IIR filter at all the frequencies are below or equal to 0 dB, that is, as illustrated in FIG. 2B, the frequency response-amplitude curve of the first second-order IIR filter is translated downward (in the negative direction of the ordinate) by two units of distance to the position of $L_1'(f)$ illustrated in FIG. 2B; and as can be apparent from FIG. 2B, all the frequency response amplitudes of $L_1'(f)$ at all the frequencies in the first set of frequencies are below or equal to 0 dB.

Figure 2C:
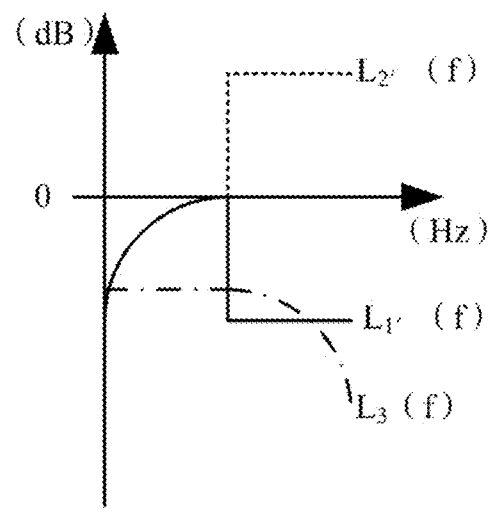

Then to ensure that the sum of the frequency response-amplitude curves of any M consecutive second-order IIR filters, starting with the frequency response-amplitude curve of the first second-order IIR filter, at each of the frequencies in the first set of frequencies is below or equal to 0 dB, and as can be apparent from FIG. 2B, the maximum of the sum of the frequency response amplitudes of $L_1'(f)$ and $L_2(f)$ at each of the frequencies in the first set of frequencies is 1, so $L_2(f)$ needs to be moved downward by one unit of distance so that the sum of the frequency-amplitude curves of adjusted $L_1(f)$ and $L_2(f)$ at each of the frequencies in the first set of frequencies is below or equal to 0 dB, that is, as illustrated in FIG. 2C, $L_2(f)$ is moved to the position of $L_2'(f)$ illustrated in FIG. 2C; and as can be apparent from FIG. 2C, the sum of the frequency responses of $L_1'(f)$ and $L_2'(f)$ at each of the frequencies in the first set of frequencies is below or equal to 0 dB.

Figure 2D:
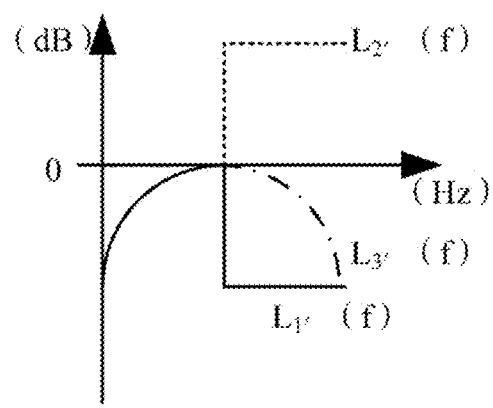

Lastly the frequency response-amplitude curve of the third second-order IIR filter is adjusted so that the sum of the adjusted frequency response-amplitude curves of the three second-order IIR filters at each of the frequencies in the first set of frequencies is equal to the frequency response-amplitude curve of the AEQ at the same one of the frequencies. As illustrated in FIG. 2D, the frequency response-amplitude curve $L_1(f)$ of the first second-order IIR filter is translated downward by two units of distance, and the frequency response-amplitude curve $L_2(f)$ of the second second-order IIR filter is translated downward by one unit of distance; and the frequency response-amplitude curve of the third second-order IIR filter shall be moved upward (in the positive direction of the ordinate) by three units of distance to the position of $L_3'(f)$ illustrated in FIG. 2D so that the sum of the frequency response-amplitude curves of the three second-order IIR filters at a frequency in the first set of frequencies is equal to the frequency response of the frequency response-amplitude curve of the AEQ at the same frequency. As can be apparent from FIG. 2D, all the frequency responses of $L_1'(f)$ and $L_1'(f)+L_2'(f)$ at all the frequencies in the first set of frequencies are below or equal to 0 dB without changing the frequency response-amplitude curve of the AEQ to thereby alleviate nonlinear distortion, thus lowering the THD of the AEQ.

When $L_1(f)$, $L_2(f)$, and $L_3(f)$ are moved to the positions of LAO, $L_2'(f)$, and $L_3'(f)$ illustrated in FIG. 2D, the adjustment amount of $L_1(f)$ is −2, the adjustment amount of $L_2(f)$ is −1, and the adjustment amount of $L_3(f)$ is 3; and since $$G_k(f) = \frac{b_{k0} + b_{k1}e^{-j\frac{2\pi f}{f_s}} + b_{k2}e^{-j\frac{4\pi f}{f_s}}}{1 + a_{k1}e^{-j\frac{2\pi f}{f_s}} + a_{k2}e^{-j\frac{4\pi f}{f_s}}},$$

and $L_k(f)=20 \log_{10}|G_k(f)|$, the first set of parameters, and the second set of parameters are adjusted, for example, so that the adjusted first set of parameters is $\{a'_{k1}, a'_{k2}, k=1, 2, 3\}$, and the adjusted second set of parameters is $\{b'_{k0}, b'_{k1}, b'_{k2}, k=1, 2, 3\}$, there are $[a'_{k1}, a'_{k2}]=[a_{k1}, a_{k2}]$, and $[b'_{k0}, b'_{k1}, b'_{k2}]=[b_{k0}, b_{k1}, b_{k2}]\times 10^{0.05\delta_k}$, where k=1, 2, 3, $\delta_k$ represents the adjustment amounts of the frequency response-amplitude curves of all the second-order IIR filters, respectively.

Figure 3A:
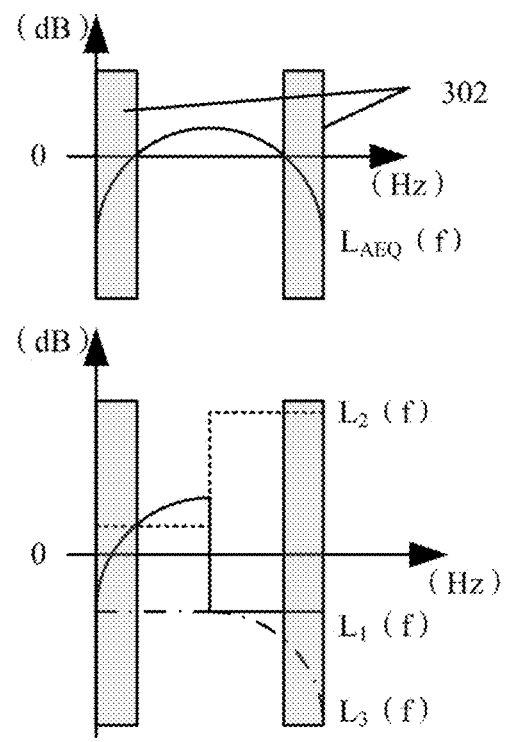
FIG. 3A to FIG. 3D are schematic principle diagrams of another method for determining a preset of an Audio Equalizer (AEQ) in accordance with an embodiment of the invention.
Figure 3B:
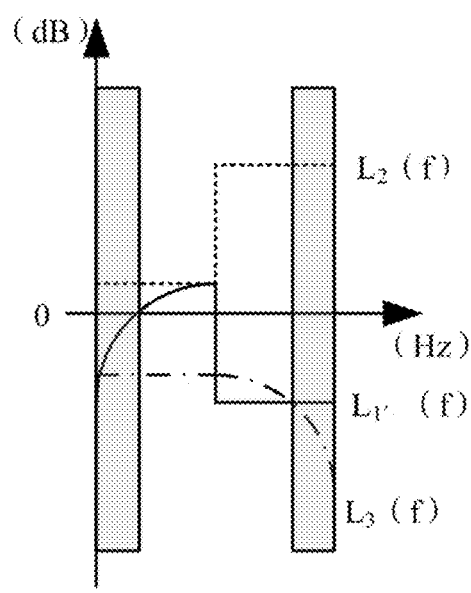

In another particular embodiment, as illustrated in FIG. 3A, the abscissa represents a frequency f, and the ordinate represents a frequency response amplitude in dB; and when the predefined preset of $\{a_{k1}, a_{k2}, b_{k0}, b_{k1}, b_{k2}, k=1, 2, 3\}$ includes the first set of parameters $\{a_{k1}, a_{k2}, k=1, 2, 3\}$, and the second set of parameters $\{b_{k0}, b_{k1}, b_{k2}, k=1, 2, 3\}$, and for f∈[0, fs/2], $L_{AEQ}$ (f)≤0 dB holds true at some frequencies, and $L_{AEQ}$ (f)>0 dB holds true at the other frequencies, then the discriminative variable "ratio" can be ratio=(0−$L_{min}$)/($L_{max}$−$L_{min}$). In the frequency response-amplitude curve of the AEQ illustrated in FIG. 3A, $L_{max}$=1, and $L_{min}$=−3, so the discriminative variable "ratio" is ratio=¾ and above the decision threshold (as can be apparent from FIG. 3A, the frequency response corresponding to the centroid of the frequency response-amplitude curve of the AEQ is below 0 dB), and then the first set of frequencies is determined from the frequency response-amplitude curve of the AEQ, where the first set of frequencies is a set consisted of those frequencies in the frequency response-amplitude curve of the AEQ at which the frequency response amplitudes are below 0 dB, so the second set of frequencies D={f: $L_{AEQ}$ (f)>0} is firstly determined, and then the first set of frequencies is the complement set of D, i.e., the frequencies of the frequency response-amplitude curve of the AEQ in the area 302 in FIG. 3A. Frequency response-amplitude curves of the three second-order IIR filters, which are $L_1(f)$, $L_2(f)$, and $L_3(f)$ respectively, are synthesized $L_{AEQ}(f)$, where as can be apparent from FIG. 3A, all the frequency responses of $L_1(f)$ and $L_1(f)+L_2(f)$ at all the frequencies in the first set of frequencies are above 0 dB, thus possibly resulting in nonlinear distortion, which would increase the THD of the AEQ. The frequency response-amplitude curves of all the second-order IIR filters are adjusted to thereby alleviate the overflows in the fixed-point outputs of all the second-order IIR filters so as to alleviate the THD of the AEQ, particularly as follows:

When the frequency response-amplitude curves of the three second-order IIR filters are adjusted, firstly to ensure that the adjusted frequency response-amplitude curve of the first second-order IIR filter at all the frequencies in the first set of frequencies are below or equal to 0 dB, that is, as illustrated in FIG. 3B, the frequency response-amplitude curve of the first second-order IIR filter is translated downward (in the negative direction of the ordinate) by one unit of distance to the position of $L_1'(f)$ illustrated in FIG. 3B; and as can be apparent from FIG. 3B, all the frequency response amplitudes of $L_1'(f)$ at all the frequencies in the first set of frequencies are below or equal to 0 dB.

Figure 3C:
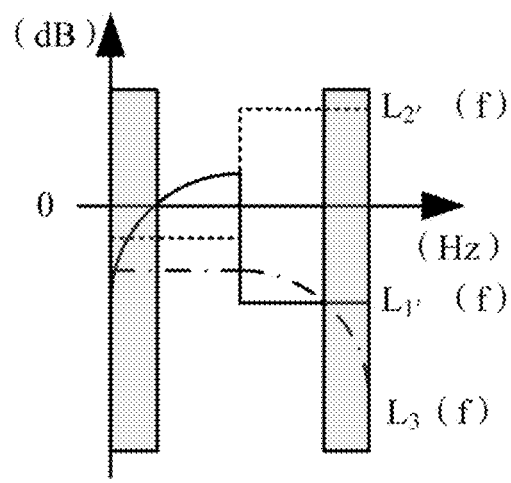

Then to ensure that the sum of the frequency response-amplitude curves of any M consecutive second-order IIR filters, starting with the frequency response-amplitude curve of the first second-order IIR filter, at each of all the frequencies in the first set of frequencies is below or equal to 0 dB, and as can be apparent from FIG. 3B, the maximum of the sum of the frequency response amplitudes of $L_1'(f)$ and $L_2(f)$ at all the frequencies in the first set of frequencies is 2, so $L_2(f)$ needs to be moved downward by two units of distance so that the sum of the frequency-amplitude curves of adjusted $L_1(f)$ and $L_2(f)$ at each of all the frequencies in the first set of frequencies is below or equal to 0 dB, that is, as illustrated in FIG. 3C, $L_2(f)$ is moved to the position of $L_2'(f)$ illustrated in FIG. 3C; and as can be apparent from FIG. 3C, the sum of the frequency response amplitudes of $L_1'(f)$ and $L_2'(f)$ at each of all the frequencies in the first set of frequencies is below or equal to 0 dB.

Figure 3D:
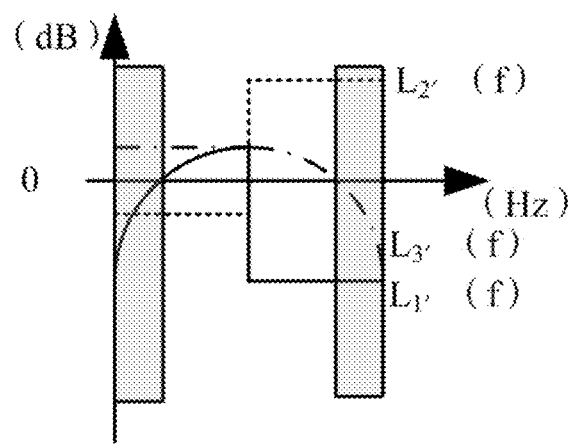

Lastly to ensure that the frequency response-amplitude curve of the third second-order IIR filter is adjusted so that the sum of the frequency response-amplitude curves of the three second-order IIR filters at each of the frequencies in the first set of frequencies is equal to the frequency response of the frequency response-amplitude curve of the AEQ at the same frequency. As illustrated in FIG. 3D, the frequency response-amplitude curve $L_1(f)$ of the first second-order IIR filter is translated downward by one unit of distance, and the frequency response-amplitude curve $L_2(f)$ of the second second-order IIR filter is translated downward by two units of distance; and the frequency response-amplitude curve of the third second-order IIR filter shall be moved upward (in the positive direction of the ordinate) by three units of distance to the position of $L_3'(f)$ illustrated in FIG. 3D so that the sum of the frequency response-amplitude curves of the three second-order IIR filters at each of the frequencies in the first set of frequencies is equal to the frequency response of the frequency response-amplitude curve of the AEQ at the same frequency. As can be apparent from FIG. 3D, all the frequency responses of $L_1'(f)$ and $L_1'(f)+L_2'(f)$ at all the frequencies in the first set of frequencies are below or equal to 0 dB to thereby alleviate nonlinear distortions, thus lowering the THD of the AEQ.

When $L_1(f)$, $L_2(f)$, and $L_3(f)$ are moved to the positions of $L_1'(f)$, $L_2'(f)$, and $L_3'(f)$ illustrated in FIG. 3D, the adjustment amount of $L_1(f)$ can be −1, the adjustment amount of $L_2(f)$ can be −2, and the adjustment amount of $L_3(f)$ can be 3; and since $$G_k(f) = \frac{b_{k0} + b_{k1}e^{-j\frac{2\pi f}{f_s}} + b_{k2}e^{-j\frac{4\pi f}{f_s}}}{1 + a_{k1}e^{-j\frac{2\pi f}{f_s}} + a_{k2}e^{-j\frac{4\pi f}{f_s}}},$$

and $L_k(f)=20\log_{10}|G_k(f)|$, the first set of parameters, and the second set of parameters are adjusted, for example, so that the adjusted first set of parameters is $\{a'_{k1}, a'_{k2}, k=1, 2, 3\}$, and the adjusted second set of parameters is $\{b'_{k0}, b'_{k1}, b'_{k2}, k=1, 2, 3\}$, there are $[a'_{k1}, a'_{k2}]=[a_{k1}, a_{k2}]$, and $[b'_{k0}, b'_{k1}, b'_{k2}]=[b_{k0}, b_{k1}, b_{k2}]\times 10^{0.05\delta_k}$, where $k=1, 2, 3$, $\delta_k$ represents the adjustment amounts of the frequency response-amplitude curves of all the second-order IIR filters, respectively.

Figure 4A:
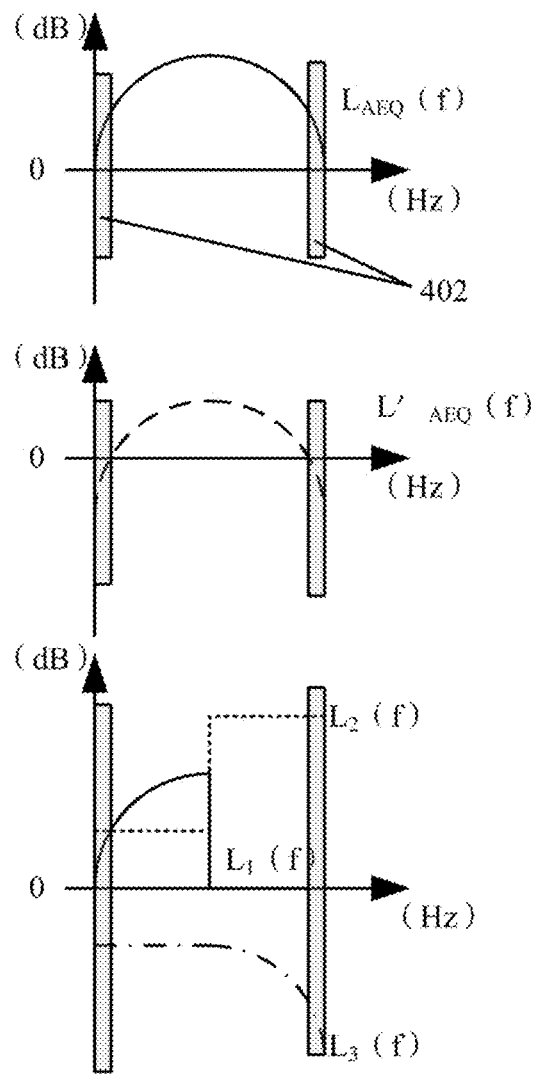
FIG. 4A to FIG. 4D are schematic principle diagrams of a further method for determining a preset of an Audio Equalizer (AEQ) in accordance with an embodiment of the invention.
Figure 4B:
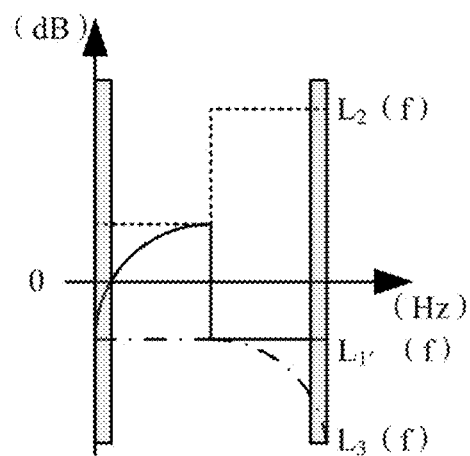

In a further particular embodiment, as illustrated in FIG. 4A, the abscissa represents a frequency f, and the ordinate represents a frequency response amplitude in dB; and when the predefined preset of $\{a_{k1}, a_{k2}, b_{k0}, b_{k1}, b_{k2}, k=1, 2, 3\}$ includes the first set of parameters $\{a_{k1}, a_{k2}, k=1, 2, 3\}$, and the second set of parameters $\{b_{k0}, b_{k1}, b_{k2}, k=1, 2, 3\}$, and for $f \in [0, fs/2]$, $L_{AEQ}(f)>0$ dB holds true, and then the discriminative variable "ratio" can be ratio=$(0-L_{min})/(L_{max}-L_{min})$. In the frequency response-amplitude curve of the AEQ illustrated in FIG. 4A, $L_{max}=4$, and $L_{min}=0$, so the discriminative variable "ratio" is ratio=0, and thus below the decision threshold (as can be apparent from FIG. 4A, the frequency response corresponding to the centroid of the frequency response-amplitude curve of the AEQ is above 0 dB), so the frequency response-amplitude curve of the AEQ needs to be translated in the pre-defined direction by the pre-defined distance, so that the first set of frequencies is determined from the translated frequency response-amplitude curve of the AEQ. As can be apparent from FIG. 4A, the first set of frequencies in the original frequency response-amplitude curve of the AEQ (the frequency response-amplitude curve of the AEQ before the translation) is a null set, and the frequency response-amplitude curve of the AEQ needs to be translated downward by the pre-defined distance, which is $\delta=L_{min}+\lambda\times(L_{max}-L_{min})$, where $\lambda$ represents a control factor, and the value of $\lambda$ ranges from 0 to 1, and preferably from 0.4 to 0.6. For example, if $\lambda=0.5$, then the pre-defined distance can be $\delta=2$. $L_{AEQ}(f)$ is translated to the position of $L_{AEQ}'(f)$ in FIG. 4A, and then the first set of frequencies is determined from the translated frequency response-amplitude curve of the AEQ, where the first set of frequencies is a set consisted of those frequencies in the translated frequency response-amplitude curve of the AEQ at which the frequency response-amplitudes are below 0 dB, so the second set of frequencies $D=\{f: L_{AEQ}'(f)>0\}$ is firstly determined, and then the first set of frequencies is the complement set of D, i.e., the frequencies of the frequency response-amplitude curve of the AEQ in the area 402 in FIG. 4A. Frequency response-amplitude curves of the three second-order IIR filters, which are $L_1(f)$, $L_2(f)$, and $L_3(f)$ respectively, are synthesized $L_{AEQ}(f)$, where as can be apparent from FIG. 4A, all the frequency responses of $L_1(f)$, $L_1(f)+L_2(f)$, and $L_1(f)+L_2(f)+L_3(f)$ at all the frequencies in the first set of frequencies are above 0 dB, thus possibly resulting in nonlinear distortions, which would increase the THD of the AEQ. The frequency response-amplitude curves of all the second-order IIR filters are adjusted to thereby alleviate overflows in fixed-point outputs of the second-order IIR filters so as to lower the THD of the AEQ, particularly as follows:

When the frequency response-amplitude curves of the three second-order IIR filters are adjusted, firstly to ensure that the adjusted frequency response-amplitude curve of the first second-order IIR filter at all the frequencies in the first set of frequencies are below or equal to 0 dB, that is, as illustrated in FIG. 4B, the frequency response-amplitude curve of the first second-order IIR filter is translated downward (in the negative direction of the ordinate) by two unit of distance to the position of $L_1'(f)$ illustrated in FIG. 4B; and as can be apparent from FIG. 4B, all the frequency responses of $L_1'(f)$ at all the frequencies in the first set of frequencies are below or equal to 0 dB.

Figure 4C:
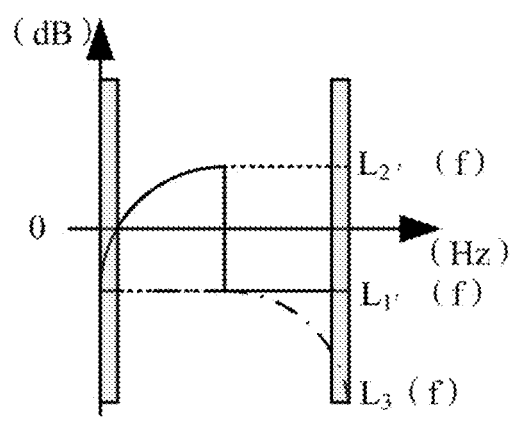

Then to ensure that the sum of the frequency response-amplitude curves of any M consecutive second-order IIR filters, starting with the frequency response-amplitude curve of the first second-order IIR filter, at each of the frequencies in the first set of frequencies is below or equal to 0 dB, and as can be apparent from FIG. 4B, the maximum of the sum of the frequency responses of $L_1'(f)$ and $L_2(f)$ at all the frequencies in the first set of frequencies is 4, so $L_2(f)$ needs to be moved downward by four units of distance so that the sum of the frequency-amplitude curves of adjusted $L_1(f)$ and $L_2(f)$ at each of the frequencies in the first set of frequencies is below or equal to 0 dB, that is, as illustrated in FIG. 4C, $L_2(f)$ is moved to the position of $L_2'(f)$ illustrated in FIG. 4C; and as can be apparent from FIG. 4C, the sum of $L_1'(f)$ and $L_2'(f)$ at each of the frequencies in the first set of frequencies is below or equal to 0 dB.

Figure 4D:
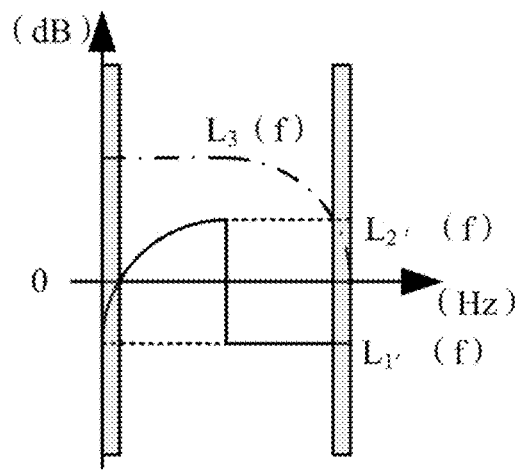
Figure 5:
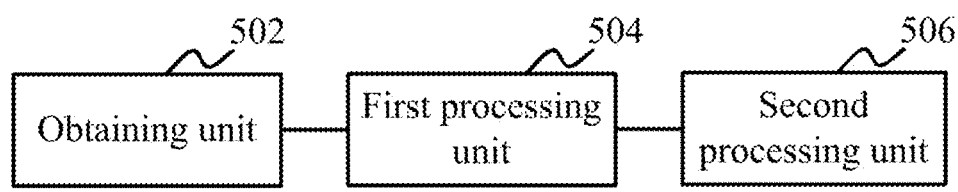
FIG. 5 and FIG. 6 are schematic structural diagrams of an apparatus for determining a preset of an Audio Equalizer (AEQ) in accordance with an embodiment of the invention.

Lastly the frequency response-amplitude curve of the third second-order IIR filter is adjusted so that the sum of the frequency response-amplitude curves of the three second-order IIR filters at each of the frequencies in the first set of frequencies is equal to the frequency response-amplitude curve of the AEQ at the same frequency. As illustrated in FIG. 4D, the frequency response-amplitude curve $L_1(f)$ of the first second-order IIR filter is translated downward by two units of distance, and the frequency response-amplitude curve $L_2(f)$ of the second second-order IIR filter is translated downward by four units of distance; and the frequency response-amplitude curve of the third second-order IIR filter shall be moved upward (in the positive direction of the ordinate) by six units of distance to the position of $L_3'(f)$ illustrated in FIG. 4D so that the sum of the frequency response-amplitude curves of the three second-order IIR filters at each of the frequencies in the first set of frequencies is equal to the frequency response-amplitude curve of the AEQ at the same frequency. As can be apparent from FIG. 4D, all the frequency response amplitudes of $L_1'(f)$ and $L_1'(f)+L_2'(f)$ at all the frequencies in the first set of frequencies are below or equal to 0 dB without changing the frequency response-amplitude curve of the AEQ, and although the frequency responses of $L_1'(f)+L_2'(f)+L_3'(f)$ at all the frequencies in the first set of frequencies are above 0 dB, nonlinear distortion is alleviated to thereby lower the THD of the AEQ, as compared with FIG. 4A where all the frequency responses of $L_1(f)$, $L_1(f)+L_2(f)$, and $L_1(f)+L_2(f)+L_3(f)$ at all the frequencies in the first set of frequencies are above 0 dB.

When $L_1(f)$, $L_2(f)$, and $L_3(f)$ are moved to the positions of $L_1'(f)$, $L_2'(f)$, and $L_3'(f)$ as illustrated in FIG. 4D, the adjustment amount of $L_1(f)$ can be −2, the adjustment amount of $L_2(f)$ can be −4, and the adjustment amount of $L_3(f)$ can be 6; and since $$G_k(f) = \frac{b_{k0} + b_{k1}e^{-j\frac{2\pi f}{f_s}} + b_{k2}e^{-j\frac{4\pi f}{f_s}}}{1 + a_{k1}e^{-j\frac{2\pi f}{f_s}} + a_{k2}e^{-j\frac{4\pi f}{f_s}}},$$

and $L_k(f)=20\log_{10}|G_k(f)|$, the first set of parameters, and the second set of parameters are adjusted, for example, so that the adjusted first set of parameters is $\{a'_{k1}, a'_{k2}, k=1, 2, 3\}$, and the adjusted second set of parameters is $\{b'_{k0}, b'_{k1}, b'_{k2}, k=1, 2, 3\}$, there are $[a'_{k1}, a'_{k2}]=[a_{k1}, a_{k2}]$, and $[b'_{k0}, b'_{k1}, b'_{k2}]=[b_{k0}, b_{k1}, b_{k2}]\times 100.05\delta k$, where $k=1, 2, 3$, $\delta_k$ represents the adjustment amounts of the frequency response-amplitude curves of all the second-order IIR filters, respectively.

In a possible implementation, in the method according to the embodiment of the invention, all the data type of all the parameters in the predefined preset of the AEQ is the fixed-point type; and after the predefined preset of the AEQ are obtained, and before the frequency response-amplitude curve of the AEQ, and the frequency response-amplitude curves of all the second-order IIR filters which are configured to synthesize the frequency response-amplitude curve of the AEQ are determined according to the first set of parameters, and the second set of parameters, the method further includes: converting all the parameters in the first set of parameters, and the second set of parameters from the fixed-point type to the corresponding floating-point type; and after the first set of parameters, and the second set of parameters are adjusted according to the adjustment amounts of the frequency response-amplitude curves of all the second-order IIR filters, and before the adjusted first set of parameters, and the adjusted second set of parameters are determined as the preset of the AEQ, the method further includes: converting all the parameters in the adjusted first set of parameters, and the adjusted second set of parameters from the floating-point type to the corresponding fixed-point type, where the frequency response-amplitude curve of the AEQ, and the frequency response-amplitude curves of all the second-order IIR filters which are configured to synthesize the frequency response-amplitude curve of the AEQ are determined according to the first set of parameters, and the second set of parameters particularly by determining the frequency response-amplitude curve of the AEQ, and the frequency response-amplitude curves of all the second-order IIR filters which are configured to synthesize the frequency response-amplitude curve of the AEQ according to the floating-point parameters in the first set of parameters, and the second set of parameters; and the adjusted first set of parameters, and the adjusted second set of parameters are determined as the preset of the AEQ particularly by determining the fixed-point parameters in the adjusted first set of parameters, and the adjusted second set of parameters as the preset of the AEQ.

In a particular implementation, the preset is converted from the fixed-point type to the floating-point type, and the adjusted parameters are converted from the floating-point type to the fixed-point type, in a number of ways, for example, they can be converted as in the prior art, as flexibly decided in a real situation.

In a particular embodiment, when the fixed-point type is represented in the Q15 format, where the Q format is represented as Q m·n with m bits representing an integer component, and n bits representing a fractional component, so the data need to be represented in (m+n+1) bits in total, and the remaining bit represents a sign bit. When the radix point is positioned to the left of the n bits (counted from the right to the left), then the precision of the fractional component can be determined. For example, Q15 represents 15 bits in the fractional component, a piece of short data occupies two bytes including the uppermost bit being a sign bit, and the succeeding 15 bits being fractional bits, and if the radix point is positioned to the left of the 15th bit, then they can represent the range as −1<X<0.9999.

The floating-type data are converted into Q15, and multiplied with 2^15; and the Q15 data are converted into floating-point data, and divided by 2^15. For example, when there is a data storage space of two bytes, then 0.333×2^15=10911=0x2A9F, where all the operations on 0.333 can be represented as 0x2A9F; and alike 10911×2^(−15)= 0.332977.

In the apparatus in accordance with the embodiment of the invention, the frequency response-amplitude curve of the AEQ, and the frequency response-amplitude curves of all the second-order IIR filters which are configured to synthesize the frequency response-amplitude curve of the AEQ are determined according to the predefined preset of the AEQ; the first set of frequencies is determined according to the frequency response-amplitude curve of the AEQ; the frequency responses of the frequency response-amplitude curves of all the second-order IIR filters at the frequencies in the first set of frequencies are adjusted accordingly so that the adjusted frequency response-amplitude curves of all the second-order IIR filters at the frequencies in the first set of frequencies satisfy the pre-defined conditions, for example, the sum of the adjusted frequency response-amplitude curves of all the first K−1 second-order IIR filters at each of the frequencies in the first set of frequencies is below or equal to the first pre-defined threshold without changing the frequency response-amplitude curve of the AEQ; and the preset is adjusted according to the adjustment amounts of the frequency response-amplitude curves of all the second-order IIR filters. As compared with the prior art where there may be such overflows occurring in fixed-point operations of each second-order IIR filters that results in nonlinear distortion, thus raising the THD of the AEQ, frequency response gains of all the second-order IIR filters can be adjusted without changing the frequency response-amplitude curve of the AEQ to thereby alleviate overflows in the fixed-point outputs of all the second-order IIR filters so as to alleviate nonlinear distortions, thus lowering the THD of the AEQ system, and improving the performance of the AEQ system.

In the apparatus in accordance with the embodiment of the invention, the frequency response-amplitude curve of the AEQ, and the frequency response-amplitude curves of all the second-order IIR filters which are configured to synthesize the frequency response-amplitude curve of the AEQ are determined according to the predefined preset of the AEQ; the first set of frequencies is determined according to the frequency response-amplitude curve of the AEQ; the frequency responses of the frequency response-amplitude curves of all the second-order IIR filters at the frequencies in the first set of frequencies are adjusted accordingly so that the adjusted frequency response-amplitude curves of all the second-order IIR filters at the frequencies in the first set of frequencies satisfy the pre-defined conditions, for example, the sum of the adjusted frequency response-amplitude curves of all the second-order IIR filters at each of the frequencies in the first set of frequencies is below or equal to the first pre-defined threshold without changing the frequency response-amplitude curve of the AEQ; and the preset is adjusted according to the adjustment amounts of the frequency response-amplitude curves of all the second-order IIR filters. As compared with the prior art where there may be such overflows occurring in fixed-point operations of each second-order IIR filters that results in nonlinear distortion, thus raising the THD of the AEQ, frequency response gains of all the second-order IIR filters can be adjusted without changing the frequency response-amplitude curve of the AEQ to thereby alleviate overflows in the fixed-point outputs of all the second-order IIR filters so as to alleviate nonlinear distortions, thus lowering the THD of the AEQ system, and improving the performance of the AEQ system.

In a possible implementation, in the apparatus in accordance with the embodiment of the invention, after frequency response-amplitude curve of the AEQ and the frequency response-amplitude curves of all the second-order IIR filters which are configured to synthesize the frequency response-amplitude curve of the AEQ are determined according to the first set of parameters and the second set of parameters, and before the first set of frequencies is determined according to the frequency response-amplitude curve of the AEQ, the first processing unit 504 is further configured: to determine a frequency response corresponding to the centroid of the frequency response-amplitude curve of the AEQ; and when the frequency response corresponding to the centroid of the frequency response-amplitude curve of the AEQ is above the second pre-defined threshold, to translate the frequency response-amplitude curve of the AEQ by the pre-defined distance in the pre-defined direction; where the first processing unit 504 configured to determine the first set of frequencies according to the frequency response-amplitude curve of the AEQ is configured: when the frequency response corresponding to the centroid of the frequency response-amplitude curve of the AEQ is below or equal to the second predefined threshold, to determine the first set of frequencies according to the frequency response-amplitude curve of the AEQ; and when the frequency response corresponding to the centroid of the frequency response-amplitude curve of the AEQ is above the second pre-defined threshold, to determine the first set of frequencies according to the translated frequency response-amplitude curve of the AEQ.

In a possible implementation, in the apparatus in accordance with the embodiment of the invention, the first processing unit 504 configured to determine the first set of frequencies according to the frequency response-amplitude curve of the AEQ is configured: to determine the second set of frequencies according to the frequency response-amplitude curve of the AEQ, where frequency responses of the frequency response-amplitude curve of the AEQ at frequencies in the second set of frequencies are above the first pre-defined threshold; and to determine the complement set of the second set of frequencies in the complete set as the first set of frequencies, where the complete set is a set consisted of all the frequencies in the frequency response-amplitude curve of the AEQ.

In a possible implementation, in the apparatus in accordance with the embodiment of the invention, the pre-defined conditions include: the first condition that the frequency responses of the frequency response-amplitude curve of the first second-order IIR filter at the frequencies in the first set of frequencies is below or equal to the third pre-defined threshold; the second condition that the sum of the frequency responses of the frequency response-amplitude curves of any M consecutive second-order IIR filters starting with the frequency response-amplitude curve of the first second-order IIR filter at each of the frequencies in the first set of frequencies is below or equal to the third pre-defined threshold, where M is any natural number which is more than 1 and less than the total number K of all the second-order IIR filters, and the third pre-defined threshold is less than or equal to the first pre-defined threshold; and the third condition that the sum of the frequency response-amplitude curves of all the second-order IIR filters at each of the frequencies in the first set of frequencies is equal to the frequency response-amplitude curve of the AEQ at the same frequency.

In a possible implementation, in the apparatus in accordance with the embodiment of the invention, all the data type of all the parameters in the predefined preset of the AEQ is the fixed-point type; and after the obtaining unit 502 obtains the predefined preset of the AEQ, and before the first processing unit 504 determines the frequency response-amplitude curve of the AEQ, and the frequency response-amplitude curves of all the second-order IIR filters which are configured to synthesize the frequency response-amplitude curve of the AEQ, according to the first set of parameters, and the second set of parameters, the first processing unit 504 is further configured: to convert all the parameters in the first set of parameters, and the second set of parameters from the fixed-point type to the corresponding floating-point type; and after the second processing unit 506 adjusts the first set of parameters, and the second set of parameters according to the adjustment amounts of the frequency response-amplitude curves of all the second-order IIR filters, and before the second processing unit 506 determines the adjusted first set of parameters, and the adjusted second set of parameters as the preset of the AEQ, the second processing unit 506 is further configured: to convert all the parameters in the adjusted first set of parameters, and the adjusted second set of parameters from the floating-point type to the fixed-point type, where the first processing unit 504 configured to determine the frequency response-amplitude curve of the AEQ, and the frequency response-amplitude curves of all the second-order IIR filters which are configured to synthesize the frequency response-amplitude curve of the AEQ, according to the first set of parameters and the second set of parameters, is configured: to determine the frequency response-amplitude curve of the AEQ, and the frequency response-amplitude curves of all the second-order IIR filters which are configured to synthesize the frequency response-amplitude curve of the AEQ according to the floating-point parameters in the first set of parameters, and the second set of parameters; and the second processing unit 506 configured to determine the adjusted first set of parameters and the adjusted second set of parameters as the preset of the AEQ is configured to determine the fixed-point parameters in the adjusted first set of parameters and the adjusted second set of parameters as the preset of the AEQ.

The apparatus for determining a preset of an Audio Equalizer (AEQ) in accordance with the embodiment of the invention can be integrated in the Audio Equalizer (AEQ) as a component of the AEQ, where the obtaining unit 502 can be embodied as a receiver, a signal receiver, etc., the first processing unit 504 can be embodied as a CPU processor, etc., and the second processing unit 506 can be embodied as a CPU processor, etc.; and of course, the first processing unit 504 and the second processing unit 506 may be embodied as the same CPU processor, or may be embodied as different CPU processors.

Figure 6:
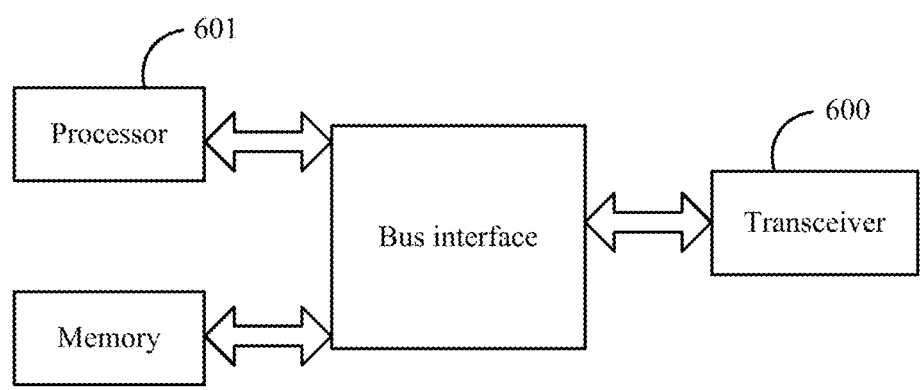

Referring to FIG. 6, an apparatus for determining a preset of an Audio Equalizer (AEQ) according to an embodiment of the invention includes a transceiver 600 and a processor 601, where:

The transceiver 600 is configured to obtain the predefined preset of the AEQ, where the preset includes a first set of parameters for determining the positions of poles of the transfer function of the AEQ system, and a second set of parameters for determining the positions of zeros of the transfer function of the AEQ system; and The processor 601 is configured to read program in a memory to execute:

To determine the frequency response-amplitude curve of the AEQ, and frequency response-amplitude curves of all the second-order IIR filters which are configured to synthesize the frequency response-amplitude curve of the AEQ, according to the first set of parameters and the second set of parameters, and to determine a first set of frequencies according to the frequency response-amplitude curve of the AEQ, where the frequency response-amplitudes of the AEQ is below or equal to a first pre-defined threshold at frequencies in the first set of frequencies; to adjust the frequency response-amplitude curves of all the second-order IIR filters at the frequencies in the first set of frequencies so that the adjusted frequency response-amplitude curves of all the second-order IIR filters at the frequencies in the first set of frequencies satisfy the pre-defined conditions, and to determine the adjustment amounts of the frequency response-amplitude curves of all the second-order IIR filters; and to adjust the first set of parameters, and the second set of parameters according to the adjustment amounts of the frequency response-amplitude curves of all the second-order IIR filters, and to determine the adjusted first set of parameters, and the adjusted second set of parameters as the preset of the AEQ.

Optionally after the frequency response-amplitude curve of the AEQ and the frequency response-amplitude curves of all the second-order IIR filters which are configured to synthesize the frequency response-amplitude curve of the AEQ are determined according to the first set of parameters and the second set of parameters, and before the first set of frequencies is determined according to the frequency response-amplitude curve of the AEQ, the processor 601 is further configured: to determine a frequency response corresponding to the centroid of the frequency response-amplitude curve of the AEQ; and when the frequency response corresponding to the centroid of the frequency response-amplitude curve of the AEQ is above the second pre-defined threshold, to translate the frequency response-amplitude curve of the AEQ by the pre-defined distance in the pre-defined direction; where the processor 601 configured to determine the first set of frequencies according to the frequency response-amplitude curve of the AEQ is configured: when the frequency response corresponding to the centroid of the frequency response-amplitude curve of the AEQ is below or equal to the second pre-defined threshold, to determine the first set of frequencies according to the frequency response-amplitude curve of the AEQ; and when the frequency response corresponding to the centroid of the frequency response-amplitude curve of the AEQ is above the second pre-defined threshold, to determine the first set of frequencies according to the translated frequency response-amplitude curve of the AEQ.

Optionally the processor 601 configured to determine the first set of frequencies according to the frequency response-amplitude curve of the AEQ is configured:

To determine the second set of frequencies according to the frequency response-amplitude curve of the AEQ, where the frequency response-amplitudes of the AEQ at the frequencies in the second set of frequencies are above the first pre-defined threshold; and To determine the complement set of the second set of frequencies in the complete set as the first set of frequencies, where the complete set is a set consisted of all the frequencies in the frequency response-amplitude curve of the AEQ.

Optionally the pre-defined conditions include:

The first condition that the frequency response-amplitude curve of the first second-order IIR filter at the frequencies in the first set of frequencies is below or equal to the third pre-defined threshold;

The second condition that the sum of the frequency responses of the frequency response-amplitude curves of any M consecutive second-order IIR filters starting with the frequency response-amplitude curve of the first second-order IIR filter at each of the frequencies in the first set of frequencies is below or equal to the third pre-defined threshold, where M is any of the natural number which is more than 1 and less than the total number K of all the second-order IIR filters, and the third pre-defined threshold is less than or equal to the first pre-defined threshold; and The third condition that the sum of the frequency response-amplitude curves of all the second-order IIR filters at each frequency in the first set of frequencies is equal to the frequency response-amplitude curve of the AEQ at the same frequency.

Optionally all the data type of the respective parameters in the predefined preset of the AEQ is the fixed-point type; and After the transceiver 600 obtains the predefined preset of the AEQ, and before the processor 601 determines the frequency response-amplitude curve of the AEQ, and the frequency response-amplitude curves of all the second-order IIR filters which are configured to synthesize the frequency response-amplitude curve of the AEQ, according to the first set of parameters, and the second set of parameters, the processor 601 is further configured: to convert all the parameters in the first set of parameters, and the second set of parameters from the fixed-point type to the corresponding floating-point type; and After the processor 601 adjusts the first set of parameters, and the second set of parameters according to the adjustment amounts of the frequency response-amplitude curves of all the second-order IIR filters, and before the processor 601 determines the adjusted first set of parameters, and the adjusted second set of parameters as the preset of the AEQ, the processor 601 is further configured: to convert all the parameters in the adjusted first set of parameters, and the adjusted second set of parameters from the floating-point type to the corresponding fixed-point type, where:

The processor 601 configured to determine the frequency response-amplitude curve of the AEQ, and the frequency response-amplitude curves of all the second-order IIR filters which are configured to synthesize the frequency response-amplitude curve of the AEQ, according to the first set of parameters and the second set of parameters, is configured: to determine the frequency response-amplitude curve of the AEQ, and the frequency response-amplitude curves of all the second-order IIR filters which are configured to synthesize the frequency response-amplitude curve of the AEQ according to the floating-point parameters in the first set of parameters, and the second set of parameters; and The processor 601 configured to determine the adjusted first set of parameters, and the adjusted second set of parameters as the preset of the AEQ is configured to determine the fixed-point parameters in the adjusted first set of parameters, and the adjusted second set of parameters as the preset of the AEQ.

Here in FIG. 6, the bus architecture can include any number of interconnecting buses and bridges to particularly link together various circuits including one or more processors represented by the processor 604, and one or more memories represented by the memory. The bus architecture can further link together various other circuits, e.g., prophetical devices, manostats, power management circuits, etc., all of which are well known in the art, so a further description thereof will be omitted in this context. The bus interface serves as an interface. The transceiver 600 can be a number of elements including a transmitter and a receiver which are units for communication with various other devices over a transmission medium. The processor 601 is responsible for managing the bus architecture and performing normal processes, and the memory can store data for use by the processor 601 in performing the operations.

In summary, in the method and apparatus for determining a preset of an Audio Equalizer (AEQ) in accordance with the embodiments of the invention, the frequency response-amplitude curve of the AEQ, and the frequency response-amplitude curves of all the second-order IIR filters which are configured to synthesize the frequency response-amplitude curve of the AEQ are determined according to the predefined preset parameters of the AEQ; the first set of frequencies is determined according to the frequency response-amplitude curve of the AEQ; the frequency response-amplitude curves of all the first K−1 second-order IIR filters at the frequencies in the first set of frequencies are adjusted so that the adjusted frequency response-amplitude curves of all the second-order IIR filters at the frequencies in the first set of frequencies satisfy the pre-defined conditions, for example, the sum of the frequency response-amplitude curves of all the second-order IIR filters at each of the frequencies in the first set of frequencies is below or equal to the first pre-defined threshold without changing the frequency response-amplitude curve of the AEQ; and the preset is adjusted according to the adjustment amounts of the frequency response-amplitude curves of all the second-order IIR filters. Frequency response gains of all the second-order IIR filters can be adjusted without changing the frequency response-amplitude curve of the AEQ to thereby alleviate overflows in the fixed-point outputs of all the second-order IIR filters so as to alleviate nonlinear distortions, thus lowering the THD of the AEQ system, and improving the performance of the AEQ system.

Those skilled in the art shall appreciate that the embodiments of the invention can be embodied as a method, a system or a computer program product. Therefore the invention can be embodied in the form of an all-hardware embodiment, an all-software embodiment or an embodiment of software and hardware in combination. Furthermore the invention can be embodied in the form of a computer program product embodied in one or more computer useable storage mediums (including but not limited to a disk memory, a CD-ROM, an optical memory, etc.) in which computer useable program codes are contained.

The invention has been described in a flow chart and/or a block diagram of the method, the device (system) and the computer program product according to the embodiments of the invention. It shall be appreciated that respective flows and/or blocks in the flow chart and/or the block diagram and combinations of the flows and/or the blocks in the flow chart and/or the block diagram can be embodied in computer program instructions. These computer program instructions can be loaded onto a general-purpose computer, a specific-purpose computer, an embedded processor or a processor of another programmable data processing device to produce a machine so that the instructions executed on the computer or the processor of the other programmable data processing device create means for performing the functions specified in the flow(s) of the flow chart and/or the block(s) of the block diagram.

These computer program instructions can also be stored into a computer readable memory capable of directing the computer or the other programmable data processing device to operate in a specific manner so that the instructions stored in the computer readable memory create an article of manufacture including instruction means which perform the functions specified in the flow(s) of the flow chart and/or the block(s) of the block diagram.

These computer program instructions can also be loaded onto the computer or the other programmable data processing device so that a series of operational steps are performed on the computer or the other programmable data processing device to create a computer implemented process so that the instructions executed on the computer or the other programmable device provide steps for performing the functions specified in the flow(s) of the flow chart and/or the block(s) of the block diagram.

Although the preferred embodiments of the invention have been described, those skilled in the art benefiting from the underlying inventive concept can make additional modifications and variations to these embodiments. Therefore the appended claims are intended to be construed as encompassing the preferred embodiments and all the modifications and variations coming into the scope of the invention.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A method for determining a preset of an Audio Equalizer (AEQ), the method comprising:
   obtaining a predefined preset of the AEQ, wherein the preset comprises a first set of parameters for determining positions of poles of a transfer function of an AEQ system, and a second set of parameters for determining positions of zeros of the transfer function of the AEQ system;
   determining a frequency response-amplitude curve of the AEQ and frequency response-amplitude curves of all of second-order IIR filters comprised in the AEQ system according to the first set of parameters and the second set of parameters, the frequency response-amplitude curves of all of the second-order IIR filters are configured to synthesize the frequency response-amplitude curve of the AEQ;
   determining a frequency response amplitude corresponding to the centroid of the frequency response-amplitude curve of the AEQ; and when the frequency response amplitude corresponding to the centroid of the frequency response-amplitude curve of the AEQ is above a first pre-defined threshold, then shifting the frequency response-amplitude curve of the AEQ by a pre-defined distance in a pre-defined direction along the axis of the frequency response amplitude;
   determining a first set of frequencies according to the frequency response-amplitude curve of the AEQ, wherein frequency response amplitudes of the frequency response-amplitude curve of the AEQ are below or equal to a second pre-defined threshold at the frequencies in the first set of frequencies, wherein determining the first set of frequencies according to the frequency response-amplitude curve of the AEQ comprises:
   when the frequency response amplitude corresponding to the centroid of the frequency response-amplitude curve of the AEQ is below or equal to the first pre-defined threshold, determining the first set of frequencies according to the frequency response-amplitude curve of the AEQ; and
   when the frequency response amplitude corresponding to the centroid of the frequency response-amplitude curve of the AEQ is above the first pre-defined threshold, determining the first set of frequencies according to the shifted frequency response-amplitude curve of the AEQ;
   adjusting the frequency response-amplitude curves of all of the second-order IIR filters at the frequencies in the first set of frequencies so that the adjusted frequency response-amplitude curves of all of the second-order IIR filters at the frequencies in the first set of frequencies satisfy pre-defined conditions, and determining adjustment amounts of the frequency response-amplitude curves of all of the second-order IIR filters; and
   adjusting the first set of parameters and the second set of parameters according to the adjustment amounts of the frequency response-amplitude curves of all of the second-order IIR filters, and determining the adjusted first set of parameters and the adjusted second set of parameters as the preset of the AEQ.

2. The method according to claim 1, wherein the pre-defined conditions comprise:
   a first condition that the frequency response amplitudes of the frequency response-amplitude curve of the first second-order IIR filter at the frequencies in the first set of frequencies are below or equal to a third pre-defined threshold;
   a second condition that the sum of the frequency response amplitudes of the frequency response-amplitude curves of M consecutive second-order IIR filters at each of the frequencies in the first set of frequencies is below or equal to the third pre-defined threshold, wherein said frequency response-amplitude curves of said M consecutive second-order IIR filters start with the frequency response-amplitude curve of the first second-order IIR filter, M is any of the natural number which is more than 1 and less than the total number K of all of the second-order IIR filters, and the third pre-defined threshold is less than or equal to the second pre-defined threshold; and
   a third condition that the sum of the frequency response amplitudes of the frequency response-amplitude curves of all of the second-order IIR filters at each of the frequencies in the first set of frequencies is equal to the frequency response amplitude of the frequency response-amplitude curve of the AEQ at the same frequency;
   wherein all of the second-order IIR filters are connected in cascade, and the first second-order IIR filter is at a first stage of all of the second-order IIR filters.

3. The method according to claim 1, wherein all data type of all the parameters in the predefined preset parameters of the AEQ is the fixed-point type; and
   after the predefined preset of the AEQ is obtained, and before the frequency response-amplitude curve of the AEQ, and the frequency response-amplitude curves of all of the second-order IIR filters which are configured to synthesize the frequency response-amplitude curve of the AEQ are determined according to the first set of parameters and the second set of parameters, the method further comprises: converting all the parameters in the first set of parameters and the second set of parameters from the fixed-point type to the floating-point type; and after the first set of parameters and the second set of parameters are adjusted according to the adjustment amounts of the frequency response-amplitude curves of the respective second-order IIR filters, and before the adjusted first set of parameters and the adjusted second set of parameters are determined as the preset of the AEQ, the method further comprises: converting all the parameters in the adjusted first set of parameters and the adjusted second set of parameters from the floating-point type to the fixed-point type;

wherein determining the frequency response-amplitude curve of the AEQ, and the frequency response-amplitude curves of all of the second-order IIR filters which are configured to synthesize the frequency response-amplitude curve of the AEQ, according to the first set of parameters and the second set of parameters, comprises: determining the frequency response-amplitude curve of the AEQ, and the frequency response-amplitude curves of all of the second-order IIR filters which are configured to synthesize the frequency response-amplitude curve of the AEQ according to the floating-point parameters in the first set of parameters and the second set of parameters; and determining the adjusted first set of parameters and the adjusted second set of parameters as the preset of the AEQ comprises: determining the fixed-point parameters in the adjusted first set of parameters and the adjusted second set of parameters as the preset parameters of the AEQ.

4. An apparatus for determining a preset of an Audio Equalizer (AEQ), the apparatus comprising:

an obtaining unit configured to obtain a predefined preset of the AEQ, wherein the preset comprises a first set of parameters for determining positions of poles of a transfer function of an AEQ system, and a second set of parameters for determining positions of zeros of the transfer function of the AEQ system;

a first processing unit, connected with the obtaining unit, configured to determine a frequency response-amplitude curve of the AEQ, and frequency response-amplitude curves of all of second-order IIR filters comprised in the AEQ system according to the first set of parameters and the second set of parameters, the frequency response-amplitude curves of all of the second-order IIR filters being configured to synthesize the frequency response-amplitude curve of the AEQ, to determine a frequency response amplitude corresponding to the centroid of the frequency response-amplitude curve of the AEQ, and when the frequency response amplitude corresponding to the centroid of the frequency response-amplitude curve of the AEQ is above a first pre-defined threshold, to shift the frequency response-amplitude curve of the AEQ by a pre-defined distance in a pre-defined direction along the axis of the frequency response amplitude, and to determine a first set of frequencies according to the frequency response-amplitude curve of the AEQ, wherein the frequency response-amplitude curve of the AEQ is below or equal to a second pre-defined threshold at frequencies in the first set of frequencies, wherein the first processing unit is configured to determine the first set of frequencies according to the frequency response-amplitude curve of the AEQ is configured:

when the frequency response amplitude corresponding to the centroid of the frequency response-amplitude curve of the AEQ is below or equal to the first pre-defined threshold, to determine the first set of frequencies according to the frequency response-amplitude curve of the AEQ; and when the frequency response amplitude corresponding to the centroid of the frequency response-amplitude curve of the AEQ is above the first pre-defined threshold, to determine the first set of frequencies according to the shifted frequency response-amplitude curve of the AEQ; and a second processing unit, connected with the first processing unit, configured to adjust the frequency response-amplitude curves of all of the second-order IIR filters at the frequencies in the first set of frequencies so that the adjusted frequency response-amplitude curves of all of the second-order IIR filters at the frequencies in the first set of frequencies satisfy the pre-defined conditions, and to determine adjustment amounts of the frequency response-amplitude curves of all of the second-order IIR filters; and to adjust the first set of parameters and the second set of parameters according to the adjustment amounts of the frequency response-amplitude curves of all of the second-order IIR filters, and to determine the adjusted first set of parameters and the adjusted second set of parameters as the preset of the AEQ.

5. The apparatus according to claim 4, wherein the pre-defined conditions comprise:

a first condition that the frequency response amplitudes of the frequency response-amplitude curve of the first second-order IIR filter at the frequencies in the first set of frequencies are below or equal to a third pre-defined threshold;

a second condition that the sum of the frequency response amplitudes of the frequency response-amplitude curves of M consecutive second-order IIR filters at each of the frequencies in the first set of frequencies is below or equal to the third pre-defined threshold, wherein said frequency response-amplitude curves of said M consecutive second-order IIR filters start with the frequency response-amplitude curve of the first second-order IIR filter, M is any of the natural number which is more than 1 and less than the total number K of all of the second-order IIR filters, and the third pre-defined threshold is less than or equal to the second pre-defined threshold; and a third condition that the sum of the frequency response amplitudes of the frequency response-amplitude curves of all of the second-order IIR filters at each of the frequencies in the first set of frequencies is equal to the frequency response amplitude of the frequency response-amplitude curve of the AEQ at the same frequency;

wherein all of the second-order IIR filters are connected in cascade, and the first second-order IIR filter is at a first stage of all of the second-order IIR filters.

6. The apparatus according to claim 4, wherein all data type of all the parameters in the predefined preset of the AEQ is the fixed-point type; and after the obtaining unit obtains the predefined preset of the AEQ, and before the first processing unit determines the frequency response-amplitude curve of the AEQ, and the frequency response-amplitude curves of all of the second-order IIR filters which are configured to synthesize the frequency response-amplitude curve of the AEQ, according to the first set of parameters and the second set of parameters, the first processing unit is further configured: to convert all the parameters in the first set of parameters and the second set of parameters from the fixed-point type to the floating-point type; and after the second processing unit adjusts the first set of parameters and the second set of parameters according to the adjustment amounts of the frequency response-amplitude curves of the respective second-order IIR filters, and before the second processing unit determines the adjusted first set of parameters and the adjusted second set of parameters as the preset of the AEQ, the second processing unit is further configured: to convert all the parameters in the adjusted first set of parameters and the adjusted second set of parameters from the floating-point type to the fixed-point type;

wherein the first processing unit configured to determine the frequency response-amplitude curve of the AEQ, and the frequency response-amplitude curves of all of the second-order IIR filters which are configured to synthesize the frequency response-amplitude curve of the AEQ, according to the first set of parameters and the second set of parameters is configured: to determine the frequency response-amplitude curve of the AEQ, and the frequency response-amplitude curves of all of the second-order IIR filters which are configured to synthesize the frequency response-amplitude curve of the AEQ according to the floating-point parameters in the first set of parameters and the second set of parameters; and the second processing unit configured to determine the adjusted first set of parameters and the adjusted second set of parameters as the preset parameters of the AEQ is configured to determine the fixed-point parameters in the adjusted first set of parameters and the adjusted second set of parameters as the preset of the AEQ.

7. An apparatus for determining a preset of an Audio Equalizer (AEQ), the apparatus comprising:
a transceiver configured to obtain a predefined preset of the AEQ, wherein the preset comprises a first set of parameters for determining positions of poles of a transfer function of the AEQ system, and a second set of parameters for determining positions of zeros of the transfer function of an AEQ system; and
a processor configured to read program in a memory to execute:
to determine a frequency response-amplitude curve of the AEQ, and frequency response-amplitude curves of all of second-order IIR filters comprised in the AEQ system according to the first set of parameters and the second set of parameters, the frequency response-amplitude curves of all of the second-order IIR filters being configured to synthesize the frequency response-amplitude curve of the AEQ; to determine a frequency response amplitude corresponding to the centroid of the frequency response-amplitude curve of the AEQ, and when the frequency response amplitude corresponding to the centroid of the frequency response-amplitude curve of the AEQ is above a first pre-defined threshold, then to shift the frequency response-amplitude curve of the AEQ by a pre-defined distance in a pre-defined direction along the axis of the frequency response amplitude; to determine a first set of frequencies from the frequency response-amplitude curve of the AEQ, wherein frequency response amplitudes of the frequency response-amplitude curve of the AEQ are below or equal to a second pre-defined threshold at the frequencies in the first set of frequencies, wherein the processor configured to determine the first set of frequencies according to the frequency response-amplitude curve of the AEQ is configured: when the frequency response amplitude corresponding to the centroid of the frequency response-amplitude curve of the AEQ is below or equal to the first pre-defined threshold, to determine the first set of frequencies according to the frequency response-amplitude curve of the AEQ, and when the frequency response amplitude corresponding to the centroid of the frequency response-amplitude curve of the AEQ is above the first pre-defined threshold, to determine the first set of frequencies according to the shifted frequency response-amplitude curve of the AEQ; to adjust the frequency response-amplitude curves of all of the second-order IIR filters at the frequencies in the first set of frequencies so that the adjusted frequency response-amplitude curves of all of the second-order IIR filters at the frequencies in the first set of frequencies satisfy the pre-defined conditions, and to determine adjustment amounts of the frequency response-amplitude curves of all of the second-order IIR filters; and to adjust the first set of parameters and the second set of parameters according to the adjustment amounts of the frequency response-amplitude curves of all of the second-order IIR filters, and to determine the adjusted first set of parameters and the adjusted second set of parameters as the preset of the AEQ.

8. The apparatus according to claim 7, wherein the pre-defined conditions comprise:
a first condition that the frequency response amplitudes of the frequency response-amplitude curve of the first second-order IIR filter at the frequencies in the first set of frequencies are below or equal to a third pre-defined threshold;
a second condition that the sum of the frequency response amplitudes of the frequency response-amplitude curves of M consecutive second-order IIR filters at each of the frequencies in the first set of frequencies is below or equal to the third pre-defined threshold, wherein said frequency response-amplitude curves of said M consecutive second-order IIR filters start with the frequency response-amplitude curve of the first second-order IIR filter, M is any natural number which is more than 1 and less than the total number K of all of the second-order IIR filters, and the third pre-defined threshold is less than or equal to the second pre-defined threshold; and
a third condition that the sum of the frequency response amplitudes of the frequency response-amplitude curves of all of the second-order IIR filters at each of the frequencies in the first set of frequencies is equal to the frequency response amplitude of the frequency response-amplitude curve of the AEQ at the same frequency;
wherein all of the second-order IIR filters are connected in cascade, and the first second-order IIR filter is at a first stage of all of the second-order IIR filters.

9. The apparatus according to claim 7, wherein all data type of all the parameters in the predefined preset of the AEQ is the fixed-point type; and after the transceiver obtains the predefined preset of the AEQ, and before the processor determines the frequency response-amplitude curve of the AEQ, and the frequency response-amplitude curves of all of the second-order IIR filters which are configured to synthesize the frequency response-amplitude curve of the AEQ, according to the first set of parameters and the second set of parameters, the processor is further configured: to convert all the parameters in the first set of parameters and the second set of parameters from the fixed-point type to the floating-point type; and after the processor adjusts the first set of parameters and the second set of parameters according to the adjustment amounts of the frequency response-amplitude curves of the respective second-order IIR filters, and before the processor determines the adjusted first set of parameters and the adjusted second set of parameters as the preset of the AEQ, the processor is further configured: to convert all the parameters in the adjusted first set of parameters and the adjusted second set of parameters from the floating-point type to the fixed-point type, wherein:

the processor configured to determine the frequency response-amplitude curve of the AEQ, and the frequency response-amplitude curves of all of the second-order IIR filters which are configured to synthesize the frequency response-amplitude curve of the AEQ, according to the first set of parameters and the second set of parameters is configured: to determine the frequency response-amplitude curve of the AEQ, and the frequency response-amplitude curves of all of the second-order IIR filters which are configured to synthesize the frequency response-amplitude curve of the AEQ according to the floating-point parameters in the first set of parameters and the second set of parameters; and the processor configured to determine the adjusted first set of parameters and the adjusted second set of parameters as the preset of the AEQ is configured to determine the fixed-point parameters in the adjusted first set of parameters and the adjusted second set of parameters as the preset of the AEQ.

* * * * *